US009191029B2

(12) United States Patent
Fredrickson

(10) Patent No.: US 9,191,029 B2
(45) Date of Patent: Nov. 17, 2015

(54) ADDITIONAL ERROR CORRECTION APPARATUS AND METHOD

(71) Applicant: Lisa Fredrickson, Pasadena, CA (US)

(72) Inventor: Lisa Fredrickson, Pasadena, CA (US)

( * ) Notice: Subject to any disclaimer, the term of this patent is extended or adjusted under 35 U.S.C. 154(b) by 0 days.

(21) Appl. No.: 14/318,680

(22) Filed: Jun. 29, 2014

(65) Prior Publication Data

US 2015/0007000 A1    Jan. 1, 2015

Related U.S. Application Data

(63) Continuation-in-part of application No. 13/932,524, filed on Jul. 1, 2013.

(51) Int. Cl.
*H03M 13/00* (2006.01)
*H03M 13/15* (2006.01)
*H03M 13/13* (2006.01)

(52) U.S. Cl.
CPC .......... *H03M 13/154* (2013.01); *H03M 13/134* (2013.01); *H03M 13/1545* (2013.01); *H03M 13/1565* (2013.01); *H03M 13/1585* (2013.01); *H03M 13/611* (2013.01); *H03M 13/616* (2013.01)

(58) Field of Classification Search
CPC . H03M 13/03; H03M 13/134; H03M 13/611; H03M 13/616
See application file for complete search history.

(56) References Cited

U.S. PATENT DOCUMENTS 4,597,083 A * 6/1986 Stenerson ...................... 714/753
2010/0131831 A1 * 5/2010 Weingarten et al. .......... 714/782

* cited by examiner

*Primary Examiner* — Sam Rizk

(57) ABSTRACT

An encoder provides (2t–1) redundant symbols in a sequence of n coded symbols, and a decoder corrects up to t erroneous symbols in the sequence of n coded symbols corrupted by a plurality of symbol errors. The decoder uses an improved decoding method, the method solving a plurality of matrix equations, each matrix equation associated with a hypothetical location of error. By monitoring a plurality of solutions associated with hypothetical locations of error, a processor determines the actual number of errors, the locations of the erroneous symbols in the sequence of n symbols, and the erroneous symbol value at each error location. The improved decoder includes erasure processing and a correct symbol determination method similar to erasure processing.

23 Claims, 7 Drawing Sheets

ADDITIONAL ERROR CORRECTION APPARATUS AND METHOD

CROSS-REFERENCE TO RELATED APPLICATIONS

This nonprovisional patent application is a continuation in part of U.S. application Ser. No. 13/932,524, Improved Error Correction using Large Fields, with filing date Jul. 1, 2013, incorporated herein by reference, and uses the teaching of U.S. application Ser. No. 13/541,739, Construction Methods for Finite Fields with Split-Optimal Multipliers, with filing date Jul. 4, 2012, incorporated herein by reference. The latter application provides implementations of multipliers, inverters, and adders for large finite fields, constructed as a sequence of extension fields of smaller subfields. The former application provides a method for error correction using large finite fields and apparatus for correcting a small number of errors.

BACKGROUND OF THE INVENTION

1. Field of the Invention

The invention relates generally to forward error correction of data in digital communications using algebraic coding over finite fields, and particularly to an apparatus and method to reliably extend error detection and correction coding for communicated data using large finite fields.

2. Related Prior Art

A systematic (n, k) error correction code appends r redundant symbols to k data symbols to provide a sequence of (n=k+r) symbols, the r redundant symbols determined by an encoding operation. The ratio k/n is known as the code rate, and the entire sequence of n symbols is known as a codeword. A common type of error correction code is known as a Reed Solomon code. See *Polynomial Codes over Certain Finite Fields*, Irving S. Reed and Gustave Solomon, *Journal of the Society for Industrial and Applied Mathematics* (SIAM) 8 (2): pp. 300-304 (1960). A Reed Solomon code may associate a sequence of n codeword symbols with coefficients of a codeword polynomial, and an encoder provides a codeword polynomial that is a multiple of a code generating polynomial. The number of bits per symbol, m, is typically in the range from 8 to 16. Reed Solomon coding operations with m-bit symbols use the addition, multiplication, and division of a finite field with $2^m$ elements, a finite field (or Galois field) known as $GF(2^m)$.

When the codeword sequence of symbols is transmitted (or stored), one or more symbols received (or recovered from storage) may be corrupted. A first form of corruption known as a symbol erasure occurs when a receiver indicates that a particular symbol in the sequence of received symbols is likely to have an erroneous value. To correct a symbol erasure, a decoder must determine the correct symbol value at the indicated symbol location. A second form of corruption known as a symbol error occurs when a receiver estimates an erroneous value for a particular symbol without indicating a likelihood of error. To correct the symbol error, a decoder must find the location of the erroneous symbol in the sequence of received symbols and determine the correct value of the erroneous symbol.

Error correction codes may also be cross-interleaved to improve correction capability, particularly with bursty errors. See, e.g., U.S. Pat. No. 4,413,340, Error correctable data transmission method, K. Odaka, Y. Sako, I. Iwamoto, T. Doi, and L. B. Vries (1980). In a Compact Disc data storage standard, each symbol is contained in two cross-interleaved Reed Solomon codewords. See *Reed-Solomon Code and the Compact Disc*, K.A.S. Immink, in *Reed-Solomon Codes and Their Applications*, S. B. Wicker and V. K Bhargava, Editors, IEEE (1994). In the CD standard, the data can be thought of as a two-dimensional array, with rows of the array encoded to be row codewords, and columns of the array encoded to be column codewords. A column codeword is a (32, 28) code, which may be partially decoded in a prior art decoder in a first step of a prior art two-step decoding algorithm. In the first step, a typical CD decoder processes the (32, 28) column codewords, decoding to correct any single error or indicate error detection to a second step decoder. The second step uses the column error detection indications and four redundant symbols in row codewords to reliably correct s symbol erasures and t symbol errors provided that $(s+2t \le 4)$ in all rows.

A known property of Reed Solomon codes is that two different codewords with r symbols of redundancy differ in at least $(r+1)$ symbols. If a limited number or erasures and errors occur in a received sequence of n symbols corresponding to a transmitted codeword, a decoder is able to resolve the corruptions and correctly estimate the transmitted codeword. In general, if there are s symbol erasures and t symbol errors in a Reed Solomon codeword, a prior art decoder can determine the correct codeword whenever $(s+2t \le r)$.

When $(s+2t>r)$, a prior art decoder typically fails to decode the codeword properly. Two kinds of decoder failure are of primary concern. An uncorrectable error is a first kind of decoder failure where a decoder signals that something occurred in decoding indicating that the correct codeword cannot be determined with certainty. In this case, the decoder typically provides an uncorrectable indicator to accompany the estimated codeword in further processing. In cross-interleaved Reed-Solomon codes, for example, a first step column decoder operating on a column codeword may provide an uncorrectable indicator which becomes a useful erasure locator for a second step row decoder operating on a row codeword.

Misdecoding is a second kind of decoder failure where one or more decoded symbols in the codeword are incorrect but the decoder does not detect and/or indicate correction uncertainty. Typically, decoder systems are required to be highly reliable, in that the probability of misdecoding is required to be very small. A higher probability of uncorrectable error is typically allowed, in part because the codeword data may be recoverable through a retransmission or storage recovery routine, if only it is known to be in error.

For example, if the number of erasures, s, is equal to the number of redundant symbols, r, a prior art decoder may always determine an error value at each erased location. However, if any other received symbols in the codeword are incorrect, the decoder misdecodes. This high misdecoding rate is typically unacceptable, and error correction may therefore be limited to the case when s<r.

An example prior art error correction code introduced in the IBM 3370 magnetic disk drive used a Reed Solomon code with three redundant eight-bit symbols per codeword, each codeword contained approximately 170 symbols of data. Three interleaved codewords provided error correction coding for each 512-byte sector of stored data. The prior art decoder could correct any codeword with a single symbol error, and detect any codeword with two symbol errors as uncorrectable. See *Practical Error Correction Design for Engineers, Revised Second Edition*, Neal Glover and Trent Dudley, Cirrus Logic, Bloomfield, Colo. (1991), ISBN 0-927239-00-0, pp. 274-275. The prior art decoder operating on a corrupted (173, 170) codeword with three or more symbol errors either indicated an uncorrectable codeword or misdecoded, depending on the error pattern.

An efficient method of decoding Reed-Solomon codewords with errors is known as the Berlekamp-Massey Algorithm (BMA). See Berlekamp, E. R., *Algebraic Coding Theory*, Revised 1984 Ed., Aegean Park Press, Laguna Hills, Calif. (1984) ISBN 0-89412-063-8, pp. 176-189, and Massey, J. L., *Shift Register Synthesis and BCH Decoding in IEEE Trans Info. Theory*. IT-15 (1969), pp. 122-127. In a typical structure for a BMA decoder, a first step (or unit) determines a plurality of weighted sums from an estimated codeword, the weighted sums known as syndromes. A nonzero syndrome indicates a codeword with errors. A second step (or unit) determines a polynomial known as an error locator polynomial. A third step searches to find one or more roots of the locator polynomial. At each root of the locator polynomial found in the search, the decoder determines a correct value for an erroneous symbol at a corresponding location in the codeword. When the locator polynomial is of degree two, the search to find the roots of the locator polynomial may be replaced by a direct solution using an algebraic transformation and log and antilog tables for a finite field. See *Practical Error Correction Design for Engineers, Revised Second Edition*, Neal Glover and Trent Dudley, Cirrus Logic, Bloomfield, Colo. (1991), ISBN 0-927239-00-0, pp. 152-156.

In an extension of the Berlekamp-Massey Algorithm, the second step of the BMA decoding method described above is modified to provide an error-and-erasure locator polynomial. The modified Berlekamp-Massey Algorithm (MBMA) can be used to correct both errors and erasures in a corrupted codeword. See Blahut, R. E., *Theory and Practice of Error Control Codes*, Addison-Wesley ISBN 0-201-10102-5 (1983), pp. 256-260.

A known limitation of Reed Solomon coding over a finite field GF(2m) is that the total number of bits per codeword, B, is approximately limited to (B<m $2^m$). Because the number of bits per symbol is typically limited to the range from eight to sixteen, the growth of coding symbol sizes (and block transfer sizes) has not kept pace with the growth of typical bus sizes (and transfers) of modern computer systems, now typically at 32 or 64 bits per bus symbol with storage block and memory page sizes starting at 32K bits. Larger bus and block sizes are desired to support higher system throughput and larger data records. Although traditional Reed Solomon coding is possible in larger finite fields, the complexity of the required components tends to grow exponentially while throughput grows linearly.

Improved error correction codes and decoding methods are desired to overcome limitations of the prior art. In particular, improved coding methods are desired for codewords with larger code symbols from larger finite fields, preferably retaining the simplicity of coding operations from smaller subfields. In addition, improved coding methods are desired which provide higher throughput in coding operations, better protection against misdecoding, and more correction power for a given code rate.

U.S. application Ser. No. 13/541,739, Construction Methods for Finite Fields with Split-Optimal Multipliers (2012), teaches improved construction methods for finite fields and, in particular, for large finite fields with a large number of bits per symbol. Methods of coding for large finite fields are desired which achieve the benefits of higher system throughput using large symbols, but without the exponential growth in implementation complexity. U.S. application Ser. No. 13/932,524, Improved Error Correction using Large Fields (2013), specifies a general method for error correction using large finite fields and apparatus for correcting a small number of errors. Improvements are desired in an apparatus and a method of decoding for three or more errors in an error correction system using large symbols.

BRIEF SUMMARY OF THE INVENTION

An improved forward error correction system with r redundant symbols in a sequence of coded symbols locates t erroneous symbols with s erased symbols if (s+2t≤r+1).

When r is odd, (r=2$t_{max}$−1), where $t_{max}$ is the maximum number of correctable errors with no erasure locations. In a preferred embodiment with r odd, a decoder locates $t_{max}$ errors, or processes an even number of erasure locations and locates fewer remaining errors.

When r is even, (r=2$t_{max}$), where $t_{max}$ is the maximum number of correctable errors with less than two erasure locations. In a preferred embodiment, a decoder processes an odd number of erasure locations and locates $t_{max}$ or fewer remaining errors.

The error correction system operates by treating each symbol as an element of a finite field GF(Q). Each location in the sequence of coded symbols is associated with a weight, preferably from a subfield GF(L) of the symbol field GF(Q). The decoding subsystem uses an improved decoding method, the method solving one or more matrix equations, each matrix equation associated with a hypothetical location of error. By monitoring the plurality of solutions, a processor determines the actual number of errors, the locations of the erroneous symbols in the sequence symbols, and the erroneous symbol value at each error and erasure location.

DETAILED DESCRIPTION

Figure 1:
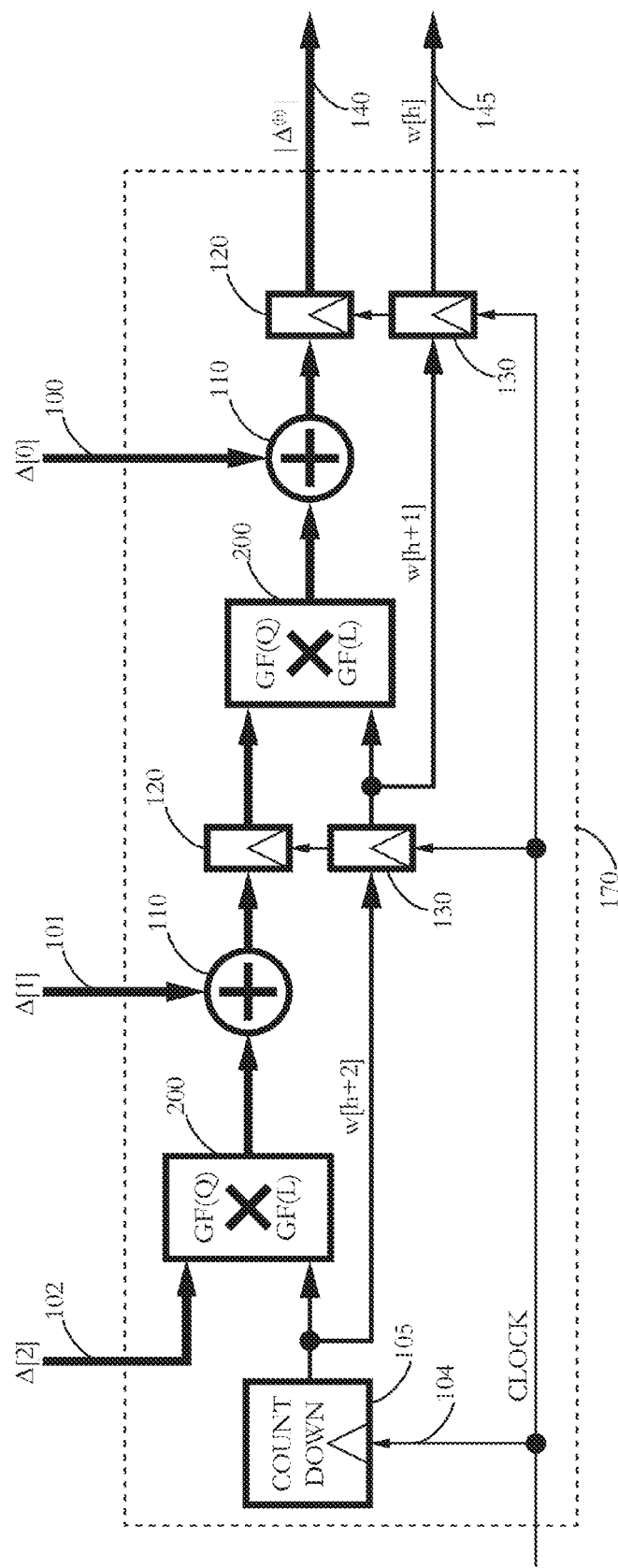
FIG. 1 is a schematic of an example multiple determinant unit (MDU), optimized to provide a plurality of determinants of two-by-two matrices.

I. Locating t Errors with S Erased Symbols and (r=2t+S−1)

A. Codeword Definition

Let $\{c_0, c_1, \ldots, c_{n-r-1}\}$ be a sequence of data symbols to be encoded, and let $\{c_0, c_1, \ldots, c_{n-1}\}$ be a corresponding sequence of symbols at the output of a systematic forward error correction (FEC) encoder. The corresponding output sequence is known as a (n, k) codeword with r symbols of redundancy and (k=n−r) symbols of data. In the notation used here, the FEC encoder provides codewords with r weighted sums satisfying the equations $$S_p = \sum_{j=0}^{n-1} w_j^{p-p_0} c_j = 0$$

where $0 \leq p < r$. The set of weights $$\{w_0, w_1, \ldots, w_{n-1}\}$$

is preselected, with each weight distinct and nonzero. The weighted sums are determined using finite field products and additions, regarding the code symbols and weights as elements in finite fields of characteristic two. The code symbols are preferably members of a large finite field GF(Q), whereas the pre-determined weights are preferably members of a locator subfield GF(L) of the symbol field GF(Q). In the weighted sum equations, weighting and summations are determined using the multiplication and addition in the field GF(Q).

The constant $p_0$ is arbitrary and may be chosen to facilitate error value determination or encoder implementation, as discussed further below. In example implementations of this section, the set of weights spans a linear range, such as the example range $\{w_i = n - i\}$, where $0 \leq i < n$, providing an easy binary comparison to check if a given weight is within the range. These examples are for illustration purposes only, and the methods described below are not limited by this example weighting. As a first alternative, standard Reed Solomon weighting may be used with $\{w_i = \alpha^i\}$ for all i, where $\alpha$ is a primitive element of GF(Q). As a second alternative, weighting may be used with $\{w_i = \beta^i\}$ for all i, where $\beta$ is a primitive element of GF(L).

B. Locating Two Errors with One Erasure and Four Redundant Symbols

U.S. application Ser. No. 13/932,524, Improved Error Correction using Large Fields (2013), describes a method and apparatus for correction of codewords with two errors and three redundant symbols. The method solves an under-determined set of three equations in four unknowns, with a small probability of an error pattern leading to an uncorrectable, ambiguous solution.

Here, a generalized method for locating symbol errors is described for codewords with more erroneous symbols and/or erased symbols. Like a traditional Reed Solomon decoding, the method performs a search over potential error locations, and the decoding method here uses a reformulation of familiar locator polynomials. Unlike a traditional Reed Solomon decoding, where the search is typically performed after finding a locator polynomial, the decoding method here performs the search as it provides various locator polynomials, which are monitored and combined to locate all errors.

In this section, the method is illustrated with a simple first example where (r=4). The encoder provides a coded sequence such that $$S_p = \sum_{j=0}^{n-1} w_j^{p-p_0} c_j = 0$$

for p=0, 1, 2, 3.

Here, $p_0$ is an arbitrary integer. A method of encoding is discussed further below in relation to error value determination and an encoder post-processor discussed below. A discussion of encoding method is therefore postponed, and a suitable method of encoding is assumed to provide a codeword with four weighted sums equal to zero.

Let $\{d_0, d_1, \ldots, d_{n-1}\}$ be an estimated codeword at the output of a receiver. The estimated codeword is used to produce four decoder weighted sums $$S_p = \sum_{j=0}^{n-1} w_j^{p-p_0} d_j$$

with p=0, 1, 2, 3. A nonzero weighted sum in the decoder is an indication of at least one symbol estimation error.

Suppose exactly three errors occur at locations with associated weights $\{w_x, w_y, w_z\}$. In this case, $d_x = c_x + e_x$, $d_y = c_y + e_y$, $d_z = c_z + e_z$, and $d_i = c_i$ for $i \notin \{x, y, z\}$.

Here, the addition indicated is the finite field addition in a field of characteristic two, implemented by the bitwise exclusive-OR (XOR) function.

A "locator polynomial" for three errors at locations $\{x, y, z\}$ with associated weights $\{w_x, w_y, w_z\}$ is given by $\Lambda(z) = (z + w_x)(z + w_y)(z + w_z) = z^3 + \Lambda_2 z^2 + \Lambda_1 z + \Lambda_0$.

See Berlekamp, E. R., *Algebraic Coding Theory, Revised 1984 Ed.*, Aegean Park Press, Laguna Hills, Calif. (1984) ISBN 0-89412-063-8, pp. 176-189. The locator polynomial is zero in a field of characteristic two when evaluated with z equal to one of the weights associated with an error location. The key equation, according to Berlekamp, finds the coefficients of a locator polynomial such that $\Lambda_2 S_2 + \Lambda_1 S_1 + \Lambda_0 S_0 = S_3$.

With three errors at locations with associated weights $\{w_x, w_y, w_z\}$, it follows that $S_0 = w_x^{-p_0} e_x + w_y^{-p_0} e_y + w_z^{-p_0} e_z$ $S_1 = w_x^{1-p_0} e_x + w_y^{1-p_0} e_y + w_z^{1-p_0} e_z$ $S_2 = w_x^{2-p_0} e_x + w_y^{2-p_0} e_y + w_z^{2-p_0} e_z$ $S_3 = w_x^{3-p_0} e_x + w_y^{3-p_0} e_y + w_z^{3-p_0} e_z$.

If the assumption of three errors is correct in a field of characteristic two, then it follows that $(w_x + w_y + w_z) S_2 + (w_x w_y + w_x w_z + w_y w_z) S_1 + w_x w_y w_z S_0 = S_3$.

Suppose that one symbol location is known to have a higher probability of error. For example, a symbol estimator provides a flag that denotes x is an erased symbol location. Location x has associated weight $w_x$. A correction value at the erased location may be required or not. Manipulating the equation above to eliminate the effect of this location, $(w_y + w_z) S_2 + (w_x [w_y + w_z] + w_y w_z) S_1 + w_x w_y w_z S_0 = S_3 + w_x S_2$, or equivalently, $(w_y + w_z)(S_2 + w_x S_1) + w_y w_z (S_1 + w_x S_0) = S_3 + w_x S_2$.

Substituting $$T_i = S_{i+1} + w_x S_i$$

for i=0, 1, 2, the previous equation becomes $$(w_y w_z) T_1 + w_y w_z T_0 = T_2.$$

Note that this transformation provides a modified key equation to find the coefficients of a modified locator polynomial for the remaining two error locations. Using this key equation, a search is performed over all other possible locations of an error (not at x). Suppose that a trial of a hypothetical error location h with weight $w_h$ attempts to solve for the remaining weight. When ($w_h = w_y$), the modified key equation isolates the remaining weight using $$w_{remaining}(T_1 + w_y T_0) = T_2 + w_y T_1.$$

If $(T_1 + w_y T_0 \neq 0)$, it follows that $$w_z = w_{remaining} = (T_2 + w_y T_1)/(T_1 + w_y T_0).$$

Similarly, when a trial of a hypothetical error location h with weight $w_h$ attempts to solve for the remaining weight in the modified key equation with ($w_h = w_z$)

$$w_{remaining}(T_1 + w_z T_0) = T_2 + w_z T_1.$$

If $(T_1 + w_z T_0 \neq 0)$, it follows that $$w_y = w_{remaining} = (T_2 + w_z T_1)/(T_1 + w_z T_0).$$

Note that the unknown weight is determined from the hypothetical weight as a quotient of two symbols from GF(Q). While monitoring the divisor and quotient produced for each hypothetical location h, each determined location weight can be checked to ensure that it is a member of the weighting subfield GF(L) and within the proper range for a codeword. When ($w_h = w_y$), the solution obtained is $w_z$; when ($w_h = w_z$), the solution obtained is $w_y$. Preferably, a large finite field GF(Q) is used so that the probability of determining an in-range weight at an incorrect hypothetical error location is small. If more than one suitable weight solution pair is found in the search, the overall solution is considered ambiguous and the codeword is flagged as uncorrectable.

Suppose that the three-error assumption is wrong and there is only one erroneous symbol $d_y$ in a location with y≠x, the erased symbol location with weight $w_x$. In this case, it follows that $$d_x = e_x + c_x$$

$$d_y = e_y + c_y$$

$$S_0 = w_x^{0-p_0} e_x + w_y^{0-p_0} e_y$$

$$S_1 = w_x^{1-p_0} e_x + w_y^{1-p_0} e_y$$

$$S_2 = w_x^{2-p_0} e_x + w_y^{2-p_0} e_y$$

$$S_3 = w_x^{3-p_0} e_x + w_y^{3-p_0} e_y$$

With two errors in a field of characteristic two, it follows that $$(w_x + w_y) S_1 + w_x w_y S_0 = S_2 \text{ and}$$

$$(w_x + w_y) S_2 + w_x w_y S_1 = S_3.$$

As above, set $T_i = S_{i+1} + w_x S_i$ for i=0, 1, 2. It follows that $$w_y T_0 = T_1 \text{ and}$$

$$w_y T_1 = T_2.$$

Suppose further that a search is conducted with the incorrect assumption of three errors and $w_h$ is the weight associated with a hypothetical location h. When ($w_h = w_y$), the equation to solve for a third error location, $$w_z(T_1 + w_h T_0) = T_2 + w_h T_1$$

is the unsolvable equation $w_z(0) = 0$. The modified weighted sums $$U_i = T_{i+1} + w_y T_i$$

for i=0, 1 are both zero, indicating that removing the effect of the error at h=y via erasure leaves no remaining errors. The remaining location solution is provided by this single error location.

Finally, suppose that there is no erroneous symbol in a location y≠x, the known erased symbol location with weight $w_x$. In this case, it follows that $$d_x = e_x,$$

$$S_0 = w_x^{0-p_0} e_x,$$

$$S_1 = w_x^{1-p_0} e_x,$$

$$S_2 = w_x^{2-p_0} e_x, \text{ and}$$

$$S_3 = w_x^{3-p_0} e_x.$$

Setting $T_i = S_{i+1} + w_x S_i$ for i=0, 1, 2 as before, it follows that $$T_0 = T_1 = T_2 = 0.$$

When original weighted sums are nonzero, but these modified weighted sums are all zero, the decoder knows that the only symbol that is erroneous is in erased location x.

Summarizing this simple example, an error correcting code using four redundant symbols is probabilistically able to locate two symbol errors with an erased symbol. The estimator or decoder erases a symbol location of a symbol most probably in error, and finds two other symbol error locations by performing a search over all hypothetical locations of one error, determining the remaining location of error. By monitoring combined weighted sums and the inputs to a divider, the actual number of remaining errors is determined by combining information from the search. The error values at all the error locations and at the erased location are determined as shown further below.

C. Five Redundant Symbols

1. Locating Three Errors

The formulation is extended with a second example where (r=5) and $p_0$ is an arbitrary integer. The encoder provides a coded sequence such that $$S_p = \sum_{j=0}^{n-1} w_j^{p-p_0} c_j = 0$$

for p=0, 1, 2, 3, 4. A suitable method of encoding is assumed to provide a codeword with five weighted sums equal to zero.

Let $\{d_0, d_1, \ldots, d_{n-1}\}$ be the estimated codeword symbols at the output of a receiver. The estimated codeword is used to produce five decoder weighted sums $$S_p = \sum_{j=0}^{n-1} w_j^{p-p_0} d_j$$

for p=0, 1, 2, 3, 4. A nonzero weighted sum is an indication of at least one symbol estimation error.

Suppose exactly three errors occur at locations $\{x, y, z\}$ with the associated weights $\{w_x, w_y, w_z\}$. As before, the locator polynomial for three errors is $$\Lambda(z) = (z+w_x)(z+w_y)(z+w_z) = z^3 + \Lambda_2 z^2 + \Lambda_1 z + \Lambda_0.$$

The key equations to find the coefficients of a locator polynomial are $$\Lambda_2 S_2 + \Lambda_1 S_1 + \Lambda_0 S_0 = S_3 \text{ and}$$

$$\Lambda_2 S_3 + \Lambda_1 S_2 + \Lambda_0 S_1 = S_4.$$

In other words, $$(w_x + w_y + w_z) S_{p+2} + (w_x w_y + w_x w_z + w_y w_z) S_{p+1} + w_x w_y w_z S_p = S_{p+3}$$

where $0 \leq p < 2$.

If x is a location of error with weight $w_x$, then $$(w_y + w_z) S_{p+2} + (w_x[w_y + w_z] + w_y w_z) S_{p+1} + w_x w_y w_z S_p = S_{p+3} + w_x S_{p+2},$$

or equivalently, $$(w_y + w_z)(S_{p+2} + w_x S_{p+1}) + w_y w_z (S_{p+1} + w_x S_p) = S_{p+3} + w_x S_{p+2}$$

for $0 \leq p < 2$. Let $$\theta_1^{(x)} = w_y + w_z \text{ and}$$

$$\Lambda_0^{(x)} = w_y w_z.$$

As above, the error locations may be determined by performing a search over hypothetical locations of one error. Define $$T_i^{(h)} = S_{i+1} + w_h S_i$$

for i=0, 1, 2, 3, and attempt to solve, for each h, the matrix equation $$\begin{bmatrix} T_1^{(h)} & T_0^{(h)} \\ T_2^{(h)} & T_1^{(h)} \end{bmatrix} \begin{bmatrix} \Lambda_1^{(h)} \\ \Lambda_0^{(h)} \end{bmatrix} = \begin{bmatrix} T_2^{(h)} \\ T_3^{(h)} \end{bmatrix}.$$

A matrix solution is possible at the locations h where $$|\Delta^{(h)}| = \begin{vmatrix} T_1^{(h)} & T_0^{(h)} \\ T_2^{(h)} & T_1^{(h)} \end{vmatrix} \neq 0.$$

At those hypothetical locations, the matrix equation has the solution $$\Lambda_1^{(h)} = \begin{vmatrix} T_2^{(h)} & T_0^{(h)} \\ T_3^{(h)} & T_1^{(h)} \end{vmatrix} / |\Delta^{(h)}|, \text{ and}$$

$$\Lambda_0^{(h)} = \begin{vmatrix} T_1^{(h)} & T_2^{(h)} \\ T_2^{(h)} & T_3^{(h)} \end{vmatrix} / |\Delta^{(h)}|.$$

For a legitimate solution, both coefficients of the locator polynomial for the remaining errors must be nonzero and in-range members of GF(L).

With three error locations, three pairs of legitimate modified locator coefficients are found during the search over all hypothetical locations of one error:

$\{\Lambda_0^{(x)}, \Lambda_1^{(x)}\}$, found when $(w_h = w_x)$;

$\{\Lambda_0^{(y)}, \Lambda_1^{(y)}\}$, found when $(w_h = w_y)$; and $\{\Lambda_0^{(z)}, \Lambda_1^{(z)}\}$, found when $(w_h = w_e)$.

The three value pairs and the found legitimate solution locations provide the following six checks of a possible three-error solution:

$$\Lambda_1^{(x)} = w_y + w_z?$$

$$\Lambda_1^{(y)} = w_x + w_z?$$

$$\Lambda_1^{(z)} = w_x + w_y?$$

$$\Lambda_0^{(x)} = w_y w_z?$$

$$\Lambda_0^{(y)} = w_x w_z?$$

$$\Lambda_0^{(z)} = w_y w_z?$$

These various checks are performed using simplified subfield addition and multiplication of the location weights and modified locator coefficients stored at locations where a viable solution is found. If a possible three-error solution passes all of these checks, the possible three-error solution is verified.

Alternatively, each error location weight found can be verified to be a root of the modified locator polynomials for the other found locations.

If the probability that two quotients of GF(Q) values, $\{\Lambda_0^{(h)}, \Lambda_1^{(h)}\}$, are both in-range members of GF(L) is sufficiently small, decoding may be restricted to those cases where exactly three pairs of legitimate location field values are found at trial locations in the search of all n possible error locations.

Alternatively, if more than three viable solutions are found at trial locations in the search of all hypothetical first error locations, all of the combinations of three viable locations can be checked for a legitimate three-error solution. If more than one legitimate three-error solution is found, the codeword is flagged as uncorrectable. Otherwise, a single legitimate three-error solution for the location weights is further processed to determine the error values, as discussed further below.

Suppose that three errors are assumed, but only two errors are present. When the hypothetical location is an error location, the determinant $|\Delta^{(h)}| = 0$. The modified locator solution at all other hypothetical locations provides the consistent locator for the two error locations.

Suppose that three errors are assumed, but only one error is present. When the hypothetical location is the error location $T_i^{(h)} = S_{i+1} + w_h S_i = 0$ for all i.

2. Locating Two Errors after Two Erasures with Five Redundant Symbols

Alternatively, if two of the error locations are known, the decoder can treat the locations as two erasures and determine the location of two additional errors. Suppose that the locations x and y, with associated weights $w_x$ and $w_y$, are treated as erasures. For i=0, 1, 2, 3, let $$T_i = S_{i+1} + w_x S_i$$

and for i=0, 1, 2, let $$U_i = T_{i+1} + w_y T_i.$$

If the remaining errors are at locations $\{a, b\}$ with associated weights $\{w_a, w_b\}$, it follows that $$(w_a + w_b) U_1 + w_a w_b U_0 = U_2.$$

By searching over all hypothetical locations $w_h$ for one remaining error location, the search results are combined to find the two error locations as discussed above.

D. An Even Number of Redundant Symbols

The method may be extended to any number of redundant symbols. In one embodiment, if the number of redundant symbols is even, an odd number of symbols are erased, as in the example with four redundant symbols above. The weight of each erased symbol is used to modify the set of weighted sums to produce a new set with one less modified sum, applicable to the odd generalized formulation of the next section.

For example, if there are six redundant symbols, the method may erase a least reliable symbol location, and determine up to three remaining error locations using five modified weighted sums as described above. Alternatively, the method may erase three least reliable symbols, and determine up to two remaining error location using three modified weighted sums as described above.

E. An Odd Number of Redundant Symbols

The generalized method is similar to that for three errors. Let $\{c_0, c_1, \ldots, c_{n-1}\}$ be the estimated symbols in a corrupted codeword at the output of a receiver. The estimated codeword is used to produce r decoder weighted sums $$S_p = \sum_{j=0}^{n-1} w_j^{p-p_0} d_j = 0$$

with $0 \leq p < r$. A nonzero decoder weighted sum indicates symbol estimation error.

A Berlekamp-Massey algorithm (BMA) decoder typically solves for the coefficients of a locator polynomial $\Lambda(z)$. To correct t errors, the BMA first solves a system of t equations in t unknown locator coefficients, the matrix equation formed from 2t weighted sums:

$$\begin{bmatrix} S_{t-1} & S_{t-2} & & S_0 \\ S_t & S_{t-1} & & S_1 \\ \vdots & \vdots & \cdots & \vdots \\ S_{2t-2} & S_{2t-3} & & S_{t-1} \end{bmatrix} \begin{bmatrix} \Lambda_{t-1} \\ \Lambda_{t-2} \\ \vdots \\ \Lambda_0 \end{bmatrix} = \begin{bmatrix} S_t \\ S_{t+1} \\ \vdots \\ S_{2t-1} \end{bmatrix}$$

Here, there is an under-determined system of (t−1) equations in t unknown coefficients, the matrix equation formed from (2t−1) weighted sums.

$$\begin{bmatrix} S_{t-1} & S_{t-2} & & S_0 \\ S_t & S_{t-1} & & S_1 \\ \vdots & \vdots & \cdots & \vdots \\ S_{2t-3} & S_{2t-4} & & S_{t-2} \end{bmatrix} \begin{bmatrix} \Lambda_{t-1} \\ \Lambda_{t-2} \\ \vdots \\ \Lambda_0 \end{bmatrix} = \begin{bmatrix} S_t \\ S_{t+1} \\ \vdots \\ S_{2t-2} \end{bmatrix}$$

As above, a first hypothetical location of error, $w_h$, is assumed, and relationships for the remaining error locations are derived. For each hypothetical location h, define a modified locator polynomial $$\Lambda^{(h)}(z) = \Lambda(z)/(z + w_h) = \sum_{i=0}^{t-1} \Lambda_i^{(h)} z^i$$

and note that the modified locator polynomial for the remaining error location weights has (t−1) unknown coefficients. Let $$M^{(h)} = \begin{bmatrix} T_{t-2}^{(h)} & T_{t-3}^{(h)} & & T_0^{(h)} \\ T_{t-1}^{(h)} & T_{t-2}^{(h)} & & T_1^{(h)} \\ \vdots & \vdots & \cdots & \vdots \\ T_{2t-4}^{(h)} & T_{2t-5}^{(h)} & & T_{t-2}^{(h)} \end{bmatrix},$$

where $T_i^{(h)} = S_{i+1} + w_h S_i$. It follows that a modified matrix equation $$M^{(h)} \begin{bmatrix} \Lambda_{t-2}^{(h)} \\ \Lambda_{t-1}^{(h)} \\ \vdots \\ \Lambda_0^{(h)} \end{bmatrix} = \begin{bmatrix} T_{t-1}^{(h)} \\ T_t^{(h)} \\ \vdots \\ T_{2t-3}^{(h)} \end{bmatrix}$$

is a system of (t−1) equations in (t−1) unknown coefficients. If the determinant of $M^{(h)}$ is nonzero, each modified locator polynomial coefficient can be expressed as a ratio of determinants using Cramer's Rule. An improved implementation, optimized to efficiently determine a plurality of determinants using simplified subfield multipliers, is explained further below.

If the assumption that $w_h$ is the weight of an error location is correct, all of the coefficients of the modified locator polynomial are in-range members of the locator subfield. Because each determined coefficient is a ratio of two members of GF(Q), preferably with Q>>L, the probability of determining a coefficient in the subfield GF(L) is small when h is not an actual error location. The probability of determining (t−1) unknown coefficients which are all in the subfield GF(L) is very small when h is not an actual error location. In one embodiment a hypothetical error location that results in (t−1) determined coefficients which are all in the subfield GF(L) provides a suitable surrogate for in-range checking, and may be stored as a likely error location, along with the determined coefficients.

If exactly t of the assumed error locations are likely error locations, a potential solution for all of the location weights is simply the t likely error locations, and there is no need to further search for the roots of the locator polynomials, as in the BMA.

If more than t of the assumed error locations are likely error locations, a plurality of combinations of t of the likely error locations may be checked. Each potential solution for the t weights may be verified by using various subfield operations to combine the determined error location weights as in the modified locator coefficients, and verify that all coefficients match their expected values. If more than one combination of t likely error locations is verified, the ambiguity causes the codeword to be flagged as uncorrectable.

The general formulation is illustrated for correction of four errors. The decoder initially determines seven weighted sums. When h is a hypothetical error location with weight $w_h$, six modified weighted sums and modified locator coefficients are related by the following equation:

$$\begin{bmatrix} T_2^{(h)} & T_1^{(h)} & T_0^{(h)} \\ T_3^{(h)} & T_2^{(h)} & T_1^{(h)} \\ T_4^{(h)} & T_3^{(h)} & T_2^{(h)} \end{bmatrix} \begin{bmatrix} \Lambda_2^{(h)} \\ \Lambda_1^{(h)} \\ \Lambda_0^{(h)} \end{bmatrix} = \begin{bmatrix} T_3^{(h)} \\ T_4^{(h)} \\ T_5^{(h)} \end{bmatrix}$$

Using Cramer's Rule, if $$|M^{(h)}| = \begin{vmatrix} T_2^{(h)} & T_1^{(h)} & T_0^{(h)} \\ T_3^{(h)} & T_2^{(h)} & T_1^{(h)} \\ T_4^{(h)} & T_3^{(h)} & T_2^{(h)} \end{vmatrix} \neq 0,$$

the modified locator coefficients found at hypothetical location h are given by $$\Lambda_2^{(h)} = \begin{vmatrix} T_3^{(h)} & T_1^{(h)} & T_0^{(h)} \\ T_4^{(h)} & T_2^{(h)} & T_1^{(h)} \\ T_5^{(h)} & T_3^{(h)} & T_2^{(h)} \end{vmatrix} / |M^{(h)}|,$$

$$\Lambda_1^{(h)} = \begin{vmatrix} T_2^{(h)} & T_3^{(h)} & T_0^{(h)} \\ T_3^{(h)} & T_4^{(h)} & T_1^{(h)} \\ T_4^{(h)} & T_5^{(h)} & T_2^{(h)} \end{vmatrix} / |M^{(h)}|,$$

and $$\Lambda_0^{(h)} = \begin{vmatrix} T_2^{(h)} & T_1^{(h)} & T_3^{(h)} \\ T_3^{(h)} & T_2^{(h)} & T_4^{(h)} \\ T_4^{(h)} & T_3^{(h)} & T_5^{(h)} \end{vmatrix} / |M^{(h)}|.$$

When h is an actual error location and the remaining errors are at locations {x, y, z}, it turns out that $$\Lambda_2^{(h)} = w_x + w_y + w_z,$$

$$\Lambda_1^{(h)} = w_x w_y + w_y w_z + w_x w_z, \text{ and}$$

$$\Lambda_0^{(h)} = w_x w_y w_z.$$

Similarly, the modified error locator polynomial coefficients may be determined at the remaining hypothetical error locations, with viable solutions found at hypothetical locations associated with $w_x$, $w_y$, and $w_z$.

When four potential error location weights have been determined, a solution may be verified by checking that all of the modified error locator coefficients $$\{\Lambda_2^{(h)}, \Lambda_1^{(h)}, \Lambda_0^{(h)}, \Lambda_2^{(x)}, \Lambda_1^{(x)}, \Lambda_0^{(x)}, \Lambda_2^{(y)}, \Lambda_1^{(y)}, \Lambda_0^{(y)}, \Lambda_2^{(z)}, \Lambda_1^{(z)}, \Lambda_0^{(z)}\}$$

match their expected values.

Suppose that there are a total of three erroneous symbols, but four are assumed. When the hypothetical location is an error location, $|M^{(h)}|=0$. All other locations provide the locator polynomial coefficients for the three errors.

Suppose that there are a total of two erroneous symbols, but four are assumed. When the hypothetical location is any location, $|M^{(h)}|=0$, and there is no means of resolving the two error locations. The four-error decoder is augmented with a two-error decoder to handle this case. A two-error decoder, assuming a hypothetical error location and solving for the other error location, can be implemented as described above and can search in parallel with the four error decoder. Alternatively, a prior art decoding algorithm can be used to solve for two error locations, or the method of U.S. application Ser. No. 13/932,524 can be used.

In addition or in parallel, an even number of symbol locations may be erased, and fewer unknown errors found. With seven weighted sums, two locations may be erased, leaving five modified weighted sums to provide for a search for up to three additional error locations as described above. Alternatively, four locations may be erased, leaving three modified weighted sums to provide for a search for up to two additional error locations, using the method described above.

F. Optimized Locator Implementations

1. Three Error Locator

In an example with three assumed errors, an optimized implementation for determining a plurality of two-by-two determinants at various hypothetical locations is provided as follows. By pre-processing entries in a general matrix for a hypothetical location h, the determinant of $\Delta^{(h)}$ may be expressed as a polynomial in the hypothetical location weight $w_h$, as in $$|\Delta^{(h)}| = \begin{vmatrix} S_2 + w_h S_1 & S_1 + w_h S_0 \\ S_3 + w_h S_2 & S_2 + w_h S_1 \end{vmatrix} = \Delta_0 + w_h \Delta_1 + w_h^2 \Delta_2$$

The coefficients $\{\Delta_0, \Delta_1, \Delta_2\}$ are found by expanding the determinant, $$|\Delta^{(h)}| = (S_1 S_3 + S_2^2) + w_h(S_1 S_2 + S_0 S_3) + w_h^2(S_1^2 + S_0 S_2).$$

Using Horner's Rule and re-expressing, $$|\Delta^{(h)}| = \Delta_0 + w_h \Delta_1 + w_h^2 \Delta_2 = w_h(w_h \Delta_2 + \Delta_1) + \Delta_0.$$

Note that the hypothetical location's determinant may be provided by two multiplications of a symbol from GF(Q) by a location weight from GF(L), using GF(Q) summations of intermediate results.

FIG. 1 is an example circuit to provide a plurality of determinants of two-by-two matrices using the method described above, denoted a Multiple Determinant Unit MDU 170. MDU 170 has three inputs from finite field GF(Q), $\{\Delta_0, \Delta_1, \Delta_2\}$, provided on input busses $\Delta[0]$ 100, $\Delta[1]$ 101, and $\Delta[2]$ 102. A system clock is provided on input CLOCK 104. MDU 170 is a circuit with high-performance pipelining designed to provide a determinant for one location per clock cycle, the pipelining incurring a latency of two clock cycles.

In a preferred embodiment, the weight associated with the first location in a codeword is the number n of symbols in the codeword and the weights for succeeding locations count down from n. In this example, a counter COUNTDOWN 105, programmed to start at n (not shown) decrements once per clock cycle, providing the sequence of location weights. Each location weight is an element of a subfield GF(L) of the symbol field GF(Q). The output of COUNTDOWN 105 is input to a first weight multiplier 200 and a first weight register 130. A second weight register 130 is the second stage of a delay line for the hypothetical location weight, w[h] 145.

The input $\Delta[2]$ 102 is multiplied by a location weight output from COUNTDOWN 105 in the first weight multiplier 200. An example weight multiplier 200 is shown in more detail in FIG. 2. The output of the first weight multiplier 200 is added to $\Delta[1]$ 101 in a first GF(Q) adder 110, and the sum is input to a first symbol register 120. The output of first symbol register 120 is multiplied by the output from the first weight register 130 in a second weight multiplier 200. The output of the second weight multiplier 200 is added to $\Delta[0]$ 100 in a second GF(Q) adder 110, and the sum is input to a second symbol register 120. The output of the second symbol register 120 is the desired matrix determinant, $|\Delta^{(h)}|$ 140, and the output of the second weight register 130 is the corresponding hypothetical location weight, w[h] 145.

Figure 7:
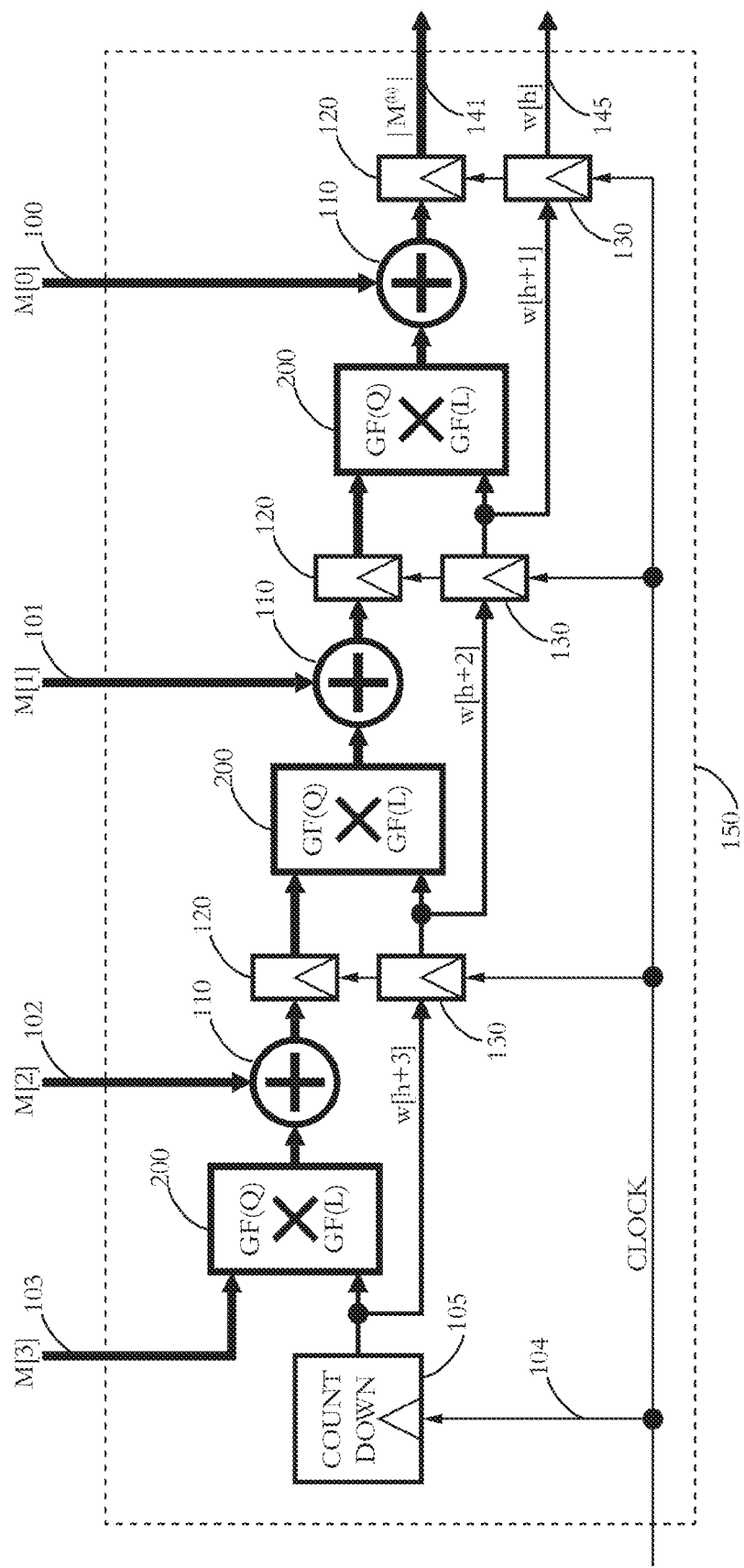
FIG. 7 is a schematic of an example MDU, optimized to provide a plurality of determinants of three-by-three matrices.

FIG. 7 is similar to FIG. 1, but depicts an example multiple determinant unit MDU 150 to provide a plurality of determinants of pre-processed three-by-three matrices using the method described above. Three-by-three MDU 150 has four inputs from finite field GF(Q), $\{M_0, M_1, M_2, M_3\}$, on input busses 100-103, respectively. Determination of $\{M_0, M_1, M_2, M_3\}$ is discussed further below. A system clock is provided on input CLOCK 104. MDU 150 has pipelining designed to provide a determinant for one location per clock cycle, the pipelining incurring a latency of three clock cycles.

The input $M_3$ M[3] 103 is multiplied by a location weight output from COUNTDOWN 105 in a first weight multiplier 200. The output of the first weight multiplier 200 is added to $M_2$ M[2] 102 in a first GF(Q) adder 110, the sum is stored in a first symbol register 120, and the associated weight is stored in a first weight register 130. Their product is the output of the second weight multiplier 200, which is added to $M_1$ M[1] 101 in a second GF(Q) adder 110; the sum is stored in a second symbol register 120, and the associated weight is stored in a second weight register 130. Their product is the output of the third weight multiplier 200, which is added to $M_0$ M[0] 100 in a third GF(Q) adder 110, and the sum is input to a third symbol register 120. The output of the third symbol register 120 is the desired matrix determinant, $|M^{(h)}|$ 141, and the output of the third weight register 130 is the corresponding hypothetical location weight, $w_h$ w[h] 145.

Figure 2:
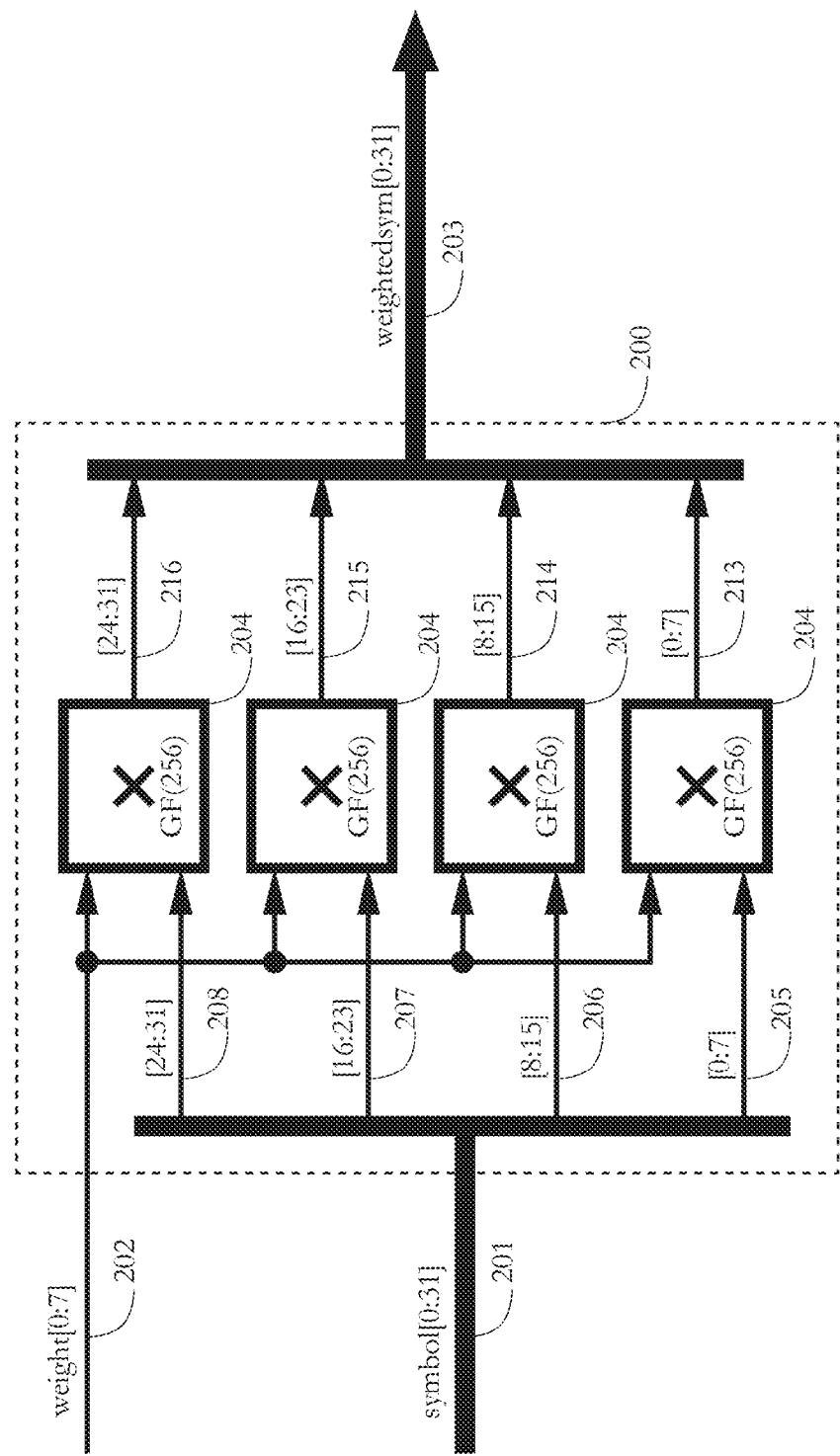
FIG. 2 is a schematic of a weight multiplier, multiplying a symbol from a finite field by a weight from a subfield of the finite field, to provide a weighted symbol output.

FIG. 2 is an example weight multiplier 200, multiplying a code symbol from GF(Q), symbol[0:31] 201 by a weight from a locator subfield GF(L), weight[0:7] 202. In this example, the locator subfield is the 8-bit subfield GF(256), and each symbol is an element of the 32-bit field GF($2^{32}$). The locator field is preferably the smallest field of characteristic two providing a sufficient number of symbols per codeword. Because each weight must be distinct and nonzero, the use of GF(256) as the locator subfield limits the number of symbols per codeword to (L−1=255) in this example. For larger codewords, GF($2^{16}$) is a suitable locator subfield. Although it is generally assumed here that the symbol field is much larger than the locator field, the coding functions are not so limited. The preferred symbol sizes with this example 8-bit locator subfield have 8, 16, 32, 64, 128, 256, or 512 bits per symbol. A typical computer bus size of 32 bits is assumed for illustration purposes and not by way of limitation. In U.S. application Ser. No. 13/932,524, various circuits with an example 64-bit symbol field extended from GF(256) are shown.

In U.S. application Ser. No. 13/541,739 Construction Methods for Finite Fields with Split-Optimal Multipliers, a method of constructing large finite fields as a sequence of extensions of a relatively small subfield is disclosed. In the constructed large finite fields, a field symbol is represented as a plurality of subfield components, through a series of doubling of a subfield symbol size. In this example, the 8-bit subfield GF(256) is preferably extended to a 16-bit subfield GF($2^{16}$), and the 16-bit subfield is preferably extended to the 32-bit symbol field GF($2^{32}$). Further, the method constructs a split-optimal parallel multiplier for a doubling extension field using four adders and three multipliers of the subfield. Using the method of '739, a full 16-bit multiplier is constructed using three 8-bit multipliers and four adders for GF(256), and a full 32-bit multiplier is constructed using nine 8-bit multipliers and twenty 8-bit adders for GF(256).

Because one of the operands in FIG. 2 is a member of a relatively small subfield, the simplified weight multiplier 200 can represent a significant improvement in performance, including savings in area/power and improvement in throughput, as compared to full multipliers in other error correction systems such as BMA decoders. The simplified multiplication is performed by an 8-bit multiplication of each 8-bit component of the symbol field. In FIG. 2, a 32-bit input bus symbol[0:31] 201 has bit indices numbered from 0 to 31. The first group of eight bits is present on 8-bit [0:7] bus 205, the second group of eight bits is present on [8:15] bus 206, the third group is present on [16:23] bus 207, and the fourth group is present on [24:31] bus 208. Each of the 8-bit busses 205-208 is multiplied by the 8-bit input weight[0:7] 202 in four GF(256) multipliers 204. The outputs of the four multipliers, busses 213-216, are combined into a 32-bit output bus, weightedsym[0:31] 203. A similar parallel 64-bit weighting multiplier (not shown) for 64-bit symbols uses eight parallel 8-bit multipliers.

Figure 3:
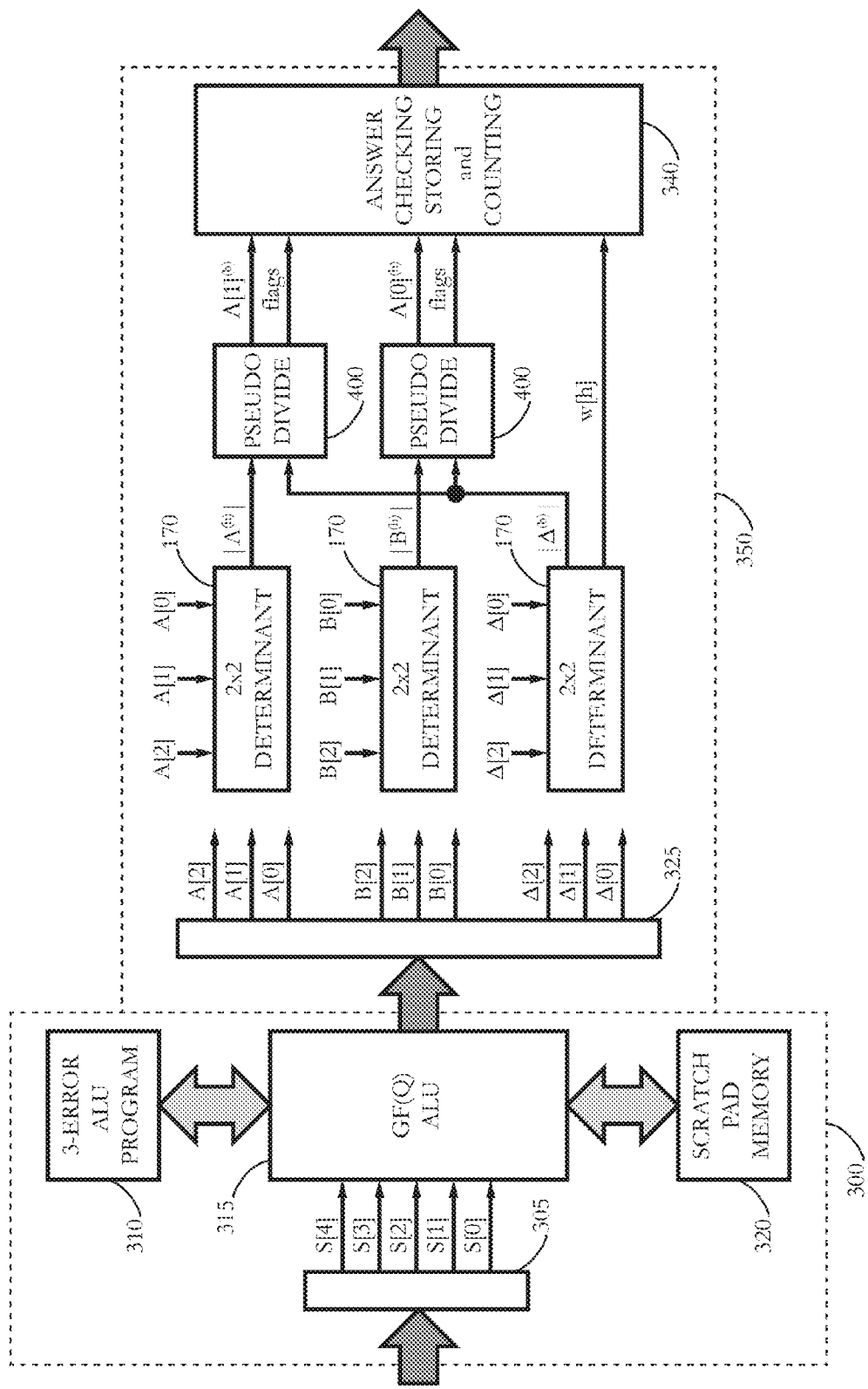
FIG. 3 is a schematic of an example decoder circuit to locate three or fewer errors combining an arithmetic logic unit operating over a large finite field with a searching apparatus containing a plurality of MDUs.

Discussion of four-error decoding circuitry is postponed to continue with the three-error decoding example. FIG. 3 is a simplified schematic of an example circuit to determine three or fewer error locations.

When three errors occur, a determinant equal to a numerator for providing $\Lambda_1^{(h)}$ is given by $$|A^{(h)}| = \begin{vmatrix} S_2 + w_h S_1 & S_1 + w_h S_0 \\ S_3 + w_h S_2 & S_2 + w_h S_1 \end{vmatrix},$$

where $$|A^{(h)}| = (S_1 S_4 + S_2 S_3) + w_h(S_0 S_4 + S_2^2) + w_h^2(S_0 S_3 + S_1 S_2) = A_0 + A_1 w_h + A_2 w_h^2.$$

Note that $A_2 = \Delta_1$ as determined above.

Similarly, when three errors occur, a determinant equal to a numerator for providing $\Lambda_0^{(h)}$ is given by $$|B^{(h)}| = \begin{vmatrix} S_2 + w_h S_1 & S_3 + w_h S_2 \\ S_3 + w_h S_2 & S_4 + w_h S_3 \end{vmatrix},$$

where $$|B^{(h)}| = (S_2 S_4 + S_3^2) + w_h(S_1 S_4 + S_2 S_3) + w_h^2(S_1 S_3 + S_2^2) = B_0 + B_1 w_h + B_2 w_h^2.$$

Note that $B_2 = \Delta_0$ and that $B_1 = A_0$, as above. Of the nine polynomial coefficients of $\{\Delta, A, B\}$ used to search for modified locator polynomials at various hypothetical locations, six are distinct, and each distinct coefficient may be provided as the sum of two multiplications over GF(Q).

In FIG. 3, an arithmetic logic unit ALU 315 for the field GF(Q) and supporting components are contained in coefficient provider 300. ALU 315 may optionally process erasure locations to provide modified weighted sums as described above. Here, the required error location functions of ALU 315 are to select and combine appropriate weighted sums from staging register 305 to produce the nine coefficients $A_0$-$A_2$, $B_0$-$B_2$, and $\Delta_0$-$\Delta_2$, six of which are distinct, and direct the results to the appropriate registers of staging register 325. As stated above, each of the six distinct coefficients can be obtained as the sum of two products in the field GF(Q).

Tradeoffs can be made between ALU 315 complexity and decoding latency. If the ALU is implemented as a single GF(Q) multiplier-accumulator (MAC), eleven ALU cycles are needed to compute the six coefficients, whereas a dual MAC ALU can compute the six coefficients in six ALU cycles. After eleven multiplications in a single MAC over GF(Q), all full multiplications for the three-error decoding algorithm are complete. The sequence of ALU operations to compute the coefficients is contained in a memory, three-error ALU program 310. The coefficient provider 300 may contain a local scratch pad memory 320 to contain interim results. The simplified GF(Q) ALU 315 can be compared to a more complex prior art arithmetic logic unit for a finite field as shown in FIG. 2 of U.S. Pat. No. 4,162,480, Galois Field Computer (1979).

Multiple determinant unit MDU 350 uses the determined coefficients in staging register 325 to provide a matrix solution for each hypothetical codeword location h with associated weight $w_h$. A first two-by-two MDU 170 provides the matrix determinant $|\Delta^{(h)}|$, a second MDU 170 provides $|A^{(h)}|$, and a third MDU 170 provides $|B^{(h)}|$. A first pseudo-divider 400 provides a first quotient, $$\Delta_1^{(h)} = |A^{(h)}|/|\Delta^{(h)}|,$$

and a second pseudo-divider 400 provides a second quotient, $$\Delta_0^{(h)} = |B^{(h)}|/|\Delta^{(h)}|.$$

Figure 4:
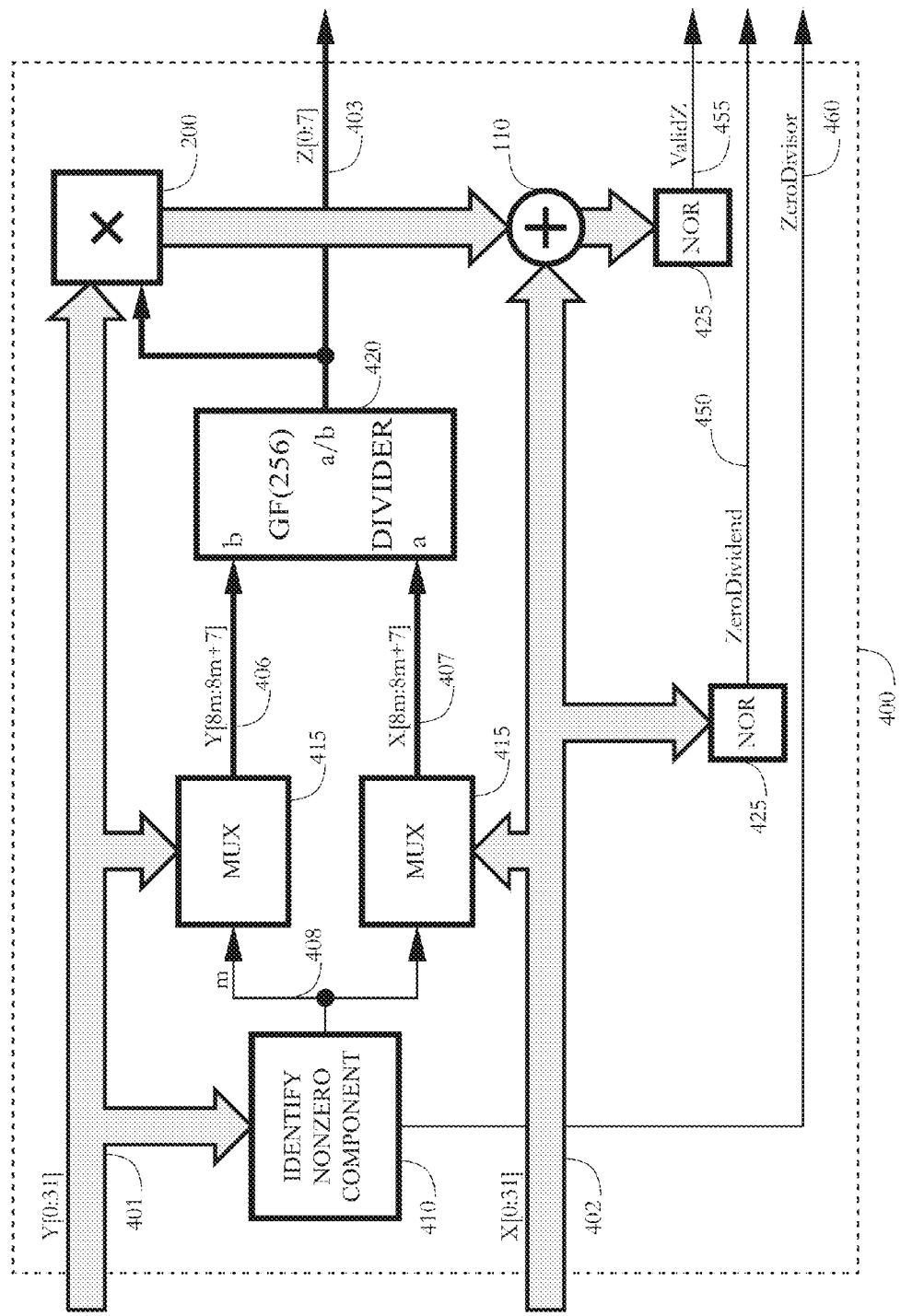
FIG. 4 is a schematic of a pseudo-divider for two symbols from a large finite field, optimized to test for and determine a quotient in a subfield of the large finite field.

A pseudo-divider 400 is shown in more detail in FIG. 4, and uses a simplified division assuming the result is a member of the locator subfield, GF(L). For some hypothetical error locations, the quotient in pseudo-divider 400 is a not a member of the locator field GF(L) or is out of range. Various result flags accompany a pseudo-divider output, to indicate if the output is a valid member of GF(L) and nonzero as shown in more detail in FIG. 4.

By pre-processing the nine coefficients of staging register 325, all the hypothetical locator polynomial solutions in a codeword can be determined using 6n simplified weight multiplications in the MDUs 170. Alternatively, the determinants at the outputs of MDUs 170 could instead be determined in the GF(Q) ALU 315. A direct two-by-two matrix determinant over GF(Q) uses two full GF(Q) multiplies for each determinant, so that all the hypothetical determinants can be provided using 6n full multiplications in the GF(Q) ALU 315. By comparison, the MDU 350 uses substantially less power for the same determinants and has lower propagation delay in each cycle.

As described above, one method of decoding counts the number of valid matrix solutions at the outputs of pseudo-dividers 400. Both pseudo-dividers must provide a valid member of GF(L) as a pre-condition for a possible valid solution. Answer Checking, Storing, and Counting Unit ACSCU 340 provides range and weighted sum checking to verify a valid solution for three error locations as described above. ACSCU 340 may also check a solution by inputting and using the weighted sums of staging register 305 or additional weighted sums, if available (transmission paths not shown).

The circuit MDU 350 of FIG. 3 may also be used to determine when fewer than three errors are present in the corrupt codeword. When there are exactly two errors in the codeword, exactly two zero determinants $|\Delta^{(h)}|$ are provided by first determinant unit 170 as it provides the determinants for all the hypothetical locations. ACSCU 340 need only count the zero determinants and record their location weights.

Similarly, when the corrupt codeword has exactly one erroneous symbol, the output of first MDU 170 is zero at all hypothetical locations. In this case, a single-error location solution can be recognized by additional quasi-divider flag monitoring (not shown).

FIG. 4 is a schematic of an example pseudo-divider 400 to divide two finite field symbols from GF(Q) to provide a quotient which is a member of a locator subfield GF(L). As before, the example implementation uses 32-bit symbols and an 8-bit locator subfield. A first 32-bit symbol input denoted X[0:31] 402 is divided by a second 32-bit symbol input denoted Y[0:31] 401 using a simplified divider assuming a quotient in a locator subfield. A first 32-bit NOR gate 425 asserts output flag ZeroDividend 450 if input X[0:31] 402 is zero.

Suppose that {X, Y, Z} are symbols in a finite field. If the quotient XY is estimated to be Z, then the estimate is confirmed by checking that X=YZ. Assuming the large field construction method as outlined above, and that Z is assumed to represent a member of a subfield GF(256), Z can be estimated by dividing an 8-bit bus representing a subfield component of X, $$X[8m:8\,m+7]407,$$

where m is an integer in the range from 0 to 3, by an 8-bit bus representing a corresponding subfield component of Y, $$Y[8m:8\,m+7]406,$$

to produce a subfield quotient Z[0:7] 403, provided that the subfield component of Y is nonzero. A nonzero component of symbol Y[0:31] 401 is detected in IDENTIFY NONZERO COMPONENT INC 410. If no nonzero component of Y[0:31] 401 is found, INC 410 provides an output flag ZeroDivisor 460. If Y[0:31] 401 is nonzero, INC 410 provides a two-bit selection address of a nonzero component m 408 to four-way 8-bit multiplexers 415, which supply the selected component X[8m:8 m+7] 407 and the corresponding nonzero component of Y[0:31] 401, Y[8m:8 m+7] 406.

The subfield quotient Z[0:7] 403 is provided by subfield divider 420. The subfield quotient Z[0:7] 403 is multiplied by the field symbol Y[0:31] 401 as a check in a simplified weight multiplier 200. The output of weight multiplier 200 is added to symbol X[0:31] 402 in finite field adder 110. If the assumption that the quotient represents a member of the subfield is valid, the output of finite field adder 110 is zero. The output of a second 32-input NOR 425 indicates the subfield quotient is valid on output flag ValidZ 455.

2. Four Error Locator

Figure 5:
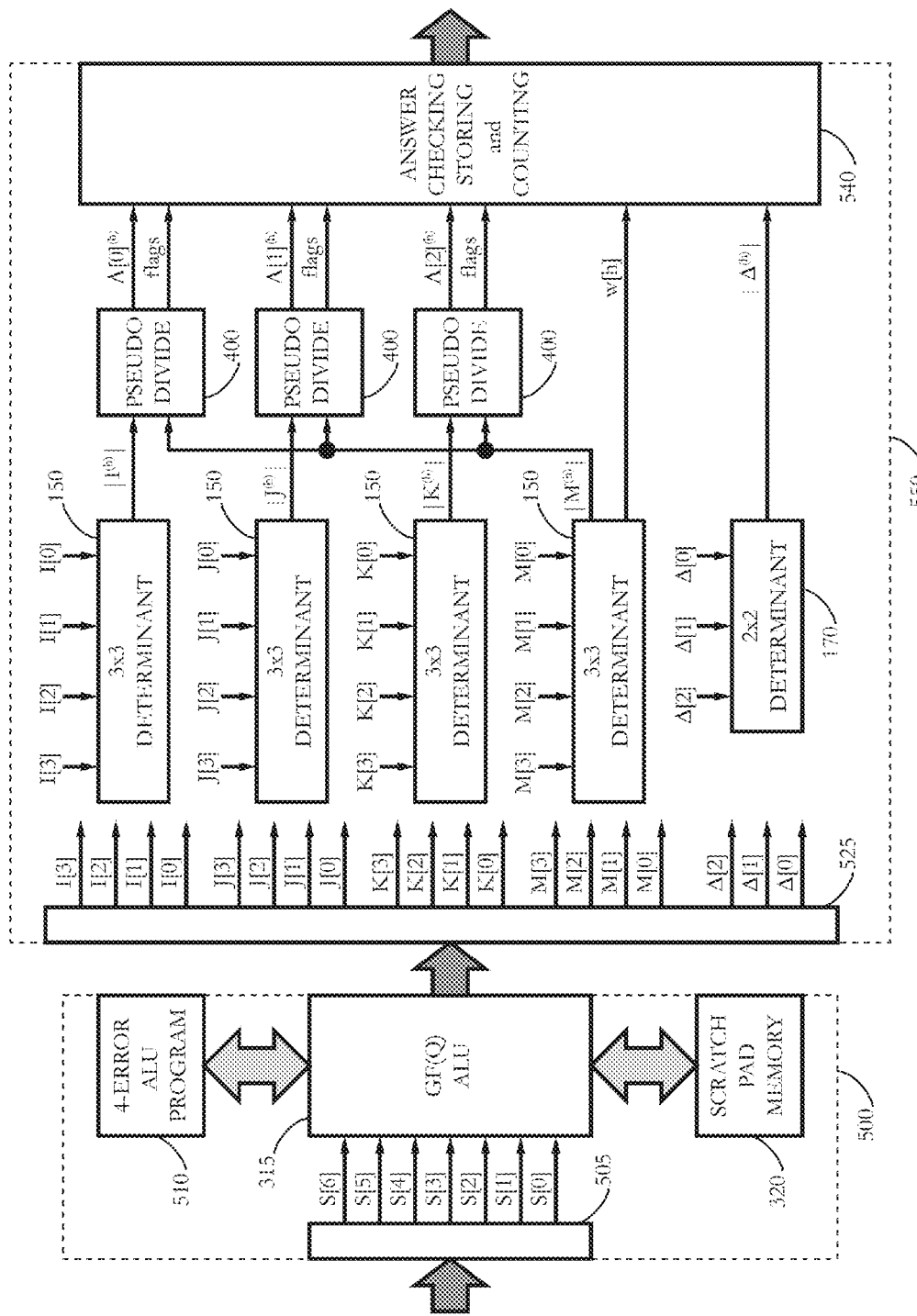
FIG. 5 is a schematic of an example decoder circuit to locate four or fewer errors combining an arithmetic logic unit operating over a large finite field with a searching apparatus containing a plurality of MDUs.

FIG. 5 is a simplified schematic of an example circuit to determine four or fewer error locations, and is similar to FIG. 3. An optimized implementation for determining a plurality of three-by-three determinants at various hypothetical locations is provided as follows. By pre-processing entries in a general matrix for a hypothetical location h, the determinant of $M^{(h)}$ may be expressed as a polynomial in the hypothetical location weight $w_h$, as in $$|M^{(h)}| = \begin{vmatrix} S_3 + w_h S_2 & S_2 + w_h S_1 & S_1 + w_h S_0 \\ S_4 + w_h S_3 & S_3 + w_h S_2 & S_2 + w_h S_1 \\ S_5 + w_h S_4 & S_4 + w_h S_3 & S_3 + w_h S_2 \end{vmatrix} = M_0 + w_h M_1 + w_h^2 M_2 + w_h^3 M_3$$

In this example with four presumed errors, the coefficients of the polynomial are as follows:

$$M_0 = S_3^3 + S_2^2 S_5 + S_1 S_4^2 + S_1 S_3 S_5$$

$$M_1 = S_2^2 S_4 + S_2 S_3^2 + S_0 S_4^2 + S_0 S_3 S_5 + S_1 S_2 S_5 + S_1 S_3 S_4$$

$$M_2 = S_1^2 S_5 + S_3 S_2^2 + S_1 S_3^2 + S_1 S_2 S_4 + S_0 S_3 S_4 + S_0 S_2 S_5$$

$$M_3 = S_2^3 + S_1^2 S_4 + S_0 S_3^2 + S_0 S_2 S_4.$$

Using Horner's Rule and re-expressing $$|M^{(h)}| = M_0 + w_h M_1 + w_h^2 M_2 + w_h^3 M_3 = w_h(w_h(w_h M_3 + M_2) + M_1) + M_0,$$

it may be observed that the four-error determinant may be provided by three multiplications of a symbol from GF(Q) by a location weight from GF(L) using GF(Q) summations of intermediate results. A three-by-three MDU 150 is shown in FIG. 7 as described above.

The modified error locator polynomial coefficients are expressed as a ratio of determinants:

$$\Lambda_2^{(h)} = |K^{(h)}|/|M^{(h)}|,$$

$$\Lambda_1^{(h)} = |J^{(h)}|/|M^{(h)}|, \text{ and}$$

$$\Lambda_0^{(h)} = |I^{(h)}|/|M^{(h)}|.$$

The coefficients of each polynomial in $w_h$ are determined by expanding the determinant of each matrix, as in the polynomial for $M^{(h)}$ described above.

The numerator coefficients are given by $$|K^{(h)}| = \begin{vmatrix} S_3 + w_h S_2 & S_2 + w_h S_1 & S_4 + w_h S_3 \\ S_4 + w_h S_3 & S_3 + w_h S_2 & S_5 + w_h S_4 \\ S_5 + w_h S_4 & S_4 + w_h S_3 & S_6 + w_h S_5 \end{vmatrix} = K_0 + w_h K_1 + w_h^2 K_2 + w_h^3 K_3,$$

$$|J^{(h)}| = \begin{vmatrix} S_3 + w_h S_2 & S_4 + w_h S_3 & S_1 + w_h S_0 \\ S_4 + w_h S_3 & S_5 + w_h S_4 & S_2 + w_h S_1 \\ S_5 + w_h S_4 & S_6 + w_h S_5 & S_3 + w_h S_2 \end{vmatrix} = J_0 + w_h J_1 + w_h^2 J_2 + w_h^3 J_3,$$

and $$|I^{(h)}| = \begin{vmatrix} S_4 + w_h S_3 & S_2 + w_h S_1 & S_1 + w_h S_0 \\ S_5 + w_h S_4 & S_3 + w_h S_2 & S_2 + w_h S_1 \\ S_6 + w_h S_5 & S_4 + w_h S_3 & S_3 + w_h S_2 \end{vmatrix} = I_0 + w_h I_1 + w_h^2 I_2 + w_h^3 I_3.$$

In FIG. 5, an arithmetic logic unit, GF(Q) ALU 315 with supporting components is contained in coefficient provider 500. Here, the required functions of ALU 315 are to select and combine appropriate weighted sums from staging register 505 to provide the sixteen coefficients $I_0$-$I_3$, $J_0$-$J_3$, $K_0$-$K_3$, $M_0$-$M_3$ in staging register 525 as well as providing support to locate two or fewer error locations, such as by providing coefficients $\Delta_0$-$\Delta_2$, as described above. The 19 coefficients of M, I, J, K, and $\Delta$ can each be obtained as a sum of products in the field GF(Q), and the coefficients share common terms. As discussed above, tradeoffs can be made between ALU complexity and decoding latency. In a preferred embodiment, GF(Q) ALU 315 is implemented as a single GF(Q) multiplier-accumulator (MAC). Alternatively, GF(Q) ALU 315 may be implemented as a dual MAC, or even as a combination of multipliers and adders to produce a three-by-three determinant in one cycle over GF(Q). The sequence of ALU operations to compute the coefficients for four errors is contained in a memory for ALU program 510. The coefficient provider 500 may contain a local scratch pad memory 320 to contain interim results. At the end of the ALU program 510 subroutine for a given codeword, staging register 525 is loaded with the desired multiple determinant evaluation coefficients.

MDU 550 uses the determined coefficients in staging register 525 to provide a matrix solution for each hypothetical codeword location h with associated weight $w_h$. A first two-by-two MDU 170 provides the matrix determinant $|\Delta^{(h)}|$, and four three-by-three MDUs 150 provide $|I^{(h)}|$, $|J^{(h)}|$, $|K^{(h)}|$, and $|M^{(h)}|$. Three pseudo-dividers 400 provide the three quotients $\{\Lambda_0^{(h)}, \Lambda_1^{(h)}, \Lambda_2^{(h)}\}$. For some hypothetical error locations, the quotient in pseudo-divider 400 is a not a member of the locator field GF(L) or is out of range. Various result flags accompany a pseudo-divider output as described above to indicate if the output is a valid member of GF(L) and nonzero.

Four-error ACSCU 540 completes the location determination for up to four errors. As before, the number of valid answers at the outputs of pseudo-dividers 400 and the number of zero determinants $|M^{(h)}|$ is counted in the test of all hypothetical locations. If four errors actually occurred, the expected number of valid solutions is at least four, and each combination of four valid solutions can be checked for overall consistency. If more than one combination of four locations is a valid solution, the codeword is considered uncorrectable and appropriately flagged. Otherwise, the unique combination of four valid locations is determined.

If ACSCU 540 operates on a corrupt codeword with 3 errors, it observes that the determinant $|M^{(h)}|$ is zero at the three error locations. If ACSCU 540 operates on a corrupt codeword with two errors, the determinant $|M^{(h)}|$ is zero at all hypothetical error locations, and the determinant $|\Delta^{(h)}|$ is zero at the two error locations. Finally, if ACSCU 540 operates on a corrupt codeword with one error, the determinants $|M^{(h)}|$ and $|\Delta^{(h)}|$ are zero at all hypothetical error locations. When both determinants are zero, one of the pseudo-dividers 400 can be alternatively configured to provide the location of a single error (not shown), or a pseudo-divider may be incorporated in the ACSCU 540 for the same purpose (not shown). ACSCU 540 may additionally process weighted sums in staging register 505 or elsewhere to check a solution (transmission path not shown).

II. Determination of Error Values

A. Generally

After the error locations are determined, the error values may be determined. For example, in a four-error correcting code with (r=7), the error values $\{e_a, e_b, e_c, e_d\}$ at locations a, b, c, and d can be determined from a four-by-four matrix equation for four of the weighted sums, such as $$\begin{bmatrix} w_a^{p-p_0} & w_b^{p-p_0} & w_c^{p-p_0} & w_d^{p-p_0} \\ w_a^{1+p-p_0} & w_b^{1+p-p_0} & w_c^{1+p-p_0} & w_d^{1+p-p_0} \\ w_a^{2+p-p_0} & w_b^{2+p-p_0} & w_c^{2+p-p_0} & w_d^{2+p-p_0} \\ w_a^{3+p-p_0} & w_b^{3+p-p_0} & w_c^{3+p-p_0} & w_d^{3+p-p_0} \end{bmatrix} \begin{bmatrix} e_a \\ e_b \\ e_c \\ e_d \end{bmatrix} = \begin{bmatrix} S_p \\ S_{p+1} \\ S_{p+2} \\ S_{p+3} \end{bmatrix}.$$

For example, if ($p_0=3$), a convenient choice is $$\begin{bmatrix} 1 & 1 & 1 & 1 \\ w_a & w_b & w_c & w_d \\ w_a^2 & w_b^2 & w_c^2 & w_d^2 \\ w_a^3 & w_b^3 & w_c^3 & w_d^3 \end{bmatrix} \begin{bmatrix} e_a \\ e_b \\ e_c \\ e_d \end{bmatrix} = \begin{bmatrix} S_3 \\ S_4 \\ S_5 \\ S_6 \end{bmatrix}.$$

The matrix on the left-side side, V, is known as a Vandermonde matrix. These matrices appear in a number of applications and various prior art algorithms to solve similar problems are beyond the scope of this disclosure. Instead, a general solution is provided and an alternate solution akin to erasure handling is provided.

Using Cramer's Rule, an error value, e.g. $e_a$, can be determined as a ratio of determinants. In this case, $$e_a = \begin{vmatrix} S_3 & 1 & 1 & 1 \\ S_4 & w_b & w_c & w_d \\ S_5 & w_b^2 & w_c^2 & w_d^2 \\ S_6 & w_b^3 & w_c^3 & w_d^3 \end{vmatrix} \Big/ |V|.$$

The determinant of the Vandermonde matrix in this case is known to be $$|V| = (w_a+w_b)(w_a+w_c)(w_a+w_d)(w_b+w_c)(w_b+w_d)(w_c+w_d).$$

The equation is re-expressed as a linear combination of the weighted sums.

$$e_a = S_3\left(\begin{vmatrix} w_b & w_c & w_d \\ w_b^2 & w_c^2 & w_d^2 \\ w_b^3 & w_c^3 & w_d^3 \end{vmatrix}\Big/|V|\right) + S_4\left(\begin{vmatrix} 1 & 1 & 1 \\ w_b^2 & w_c^2 & w_d^2 \\ w_b^3 & w_c^3 & w_d^3 \end{vmatrix}\Big/|V|\right) +$$

$$S_5\left(\begin{vmatrix} 1 & 1 & 1 \\ w_b & w_c & w_d \\ w_b^3 & w_c^3 & w_d^3 \end{vmatrix}\Big/|V|\right) + S_6\left(\begin{vmatrix} 1 & 1 & 1 \\ w_b & w_c & w_d \\ w_b^2 & w_c^2 & w_d^2 \end{vmatrix}\Big/|V|\right)$$

In Other Words $$e_a = S_3(w_b w_c^2 w_d^2(w_c+w_d) + w_c w_b^2 w_d^2(w_b+w_d) + w_d w_b^2 w_c^2(w_b+w_c))/|V| + S_4(w_c^2 w_d^2(w_c+w_d) + w_b^2 w_d^2(w_b+w_d) + w_b^2 w_c^2(w_b+w_c))/|V| + S_5(w_c w_d(w_c+w_d)^2 + w_b w_d(w_b+w_d)^2 + w_b w_c(w_b+w_c)^2)/|V| + S_6(w_c w_d(w_c+w_d) + w_b w_d(w_b+w_d) + w_b w_c(w_b+w_c))/|V|.$$

Similarly $$e_b = \begin{vmatrix} 1 & S_3 & 1 & 1 \\ w_a^3 & S_4 & w_c & w_d \\ w_a^3 & S_5 & w_c^2 & w_d^2 \\ w_a^3 & S_6 & w_c^3 & w_d^3 \end{vmatrix} \Big/ |V|,$$

$$e_c = \begin{vmatrix} 1 & 1 & S_3 & 1 \\ w_a & w_b & S_4 & w_d \\ w_a^2 & w_b^2 & S_5 & w_d^2 \\ w_b^3 & w_b^3 & S_6 & w_d^3 \end{vmatrix} \Big/ |V|, \text{ and}$$

$$e_d = \begin{vmatrix} 1 & 1 & 1 & S_3 \\ w_a & w_b & w_c & S_4 \\ w_a^2 & w_b^2 & w_c^2 & S_5 \\ w_b^3 & w_b^3 & w_c^3 & S_6 \end{vmatrix} \Big/ |V|.$$

Although evaluating this expression is not the most efficient method to determine the error value in terms of the number of steps, it may be noted that almost all operations in obtaining the numerator and denominator determinants in the expansion are operations over the subfield GF(L). After all subfield operations are complete, the error value is expressed as the sum of four weighted sums, each weighted sum comprising the product of a symbol from GF(Q) and a scalar from GF(L). By first performing a plurality of operations over GF(L), and finally combining simplified GF(Q) multiplications operations, such as that of weight multipliers 200, determination of the error values is optimized.

B. Erasure Processing for Error Values

An alternate method of determining error values is akin to the method of treating erasures above. For an illustrative example, if ($p_0=0$) and four errors exist at $\{a, b, c, d\}$, then the error values $\{e_a, e_b, e_c, e_d\}$ are the solution of the equation $$\begin{bmatrix} 1 & 1 & 1 & 1 \\ w_a & w_b & w_c & w_d \\ w_a^2 & w_b^2 & w_c^2 & w_d^2 \\ w_a^3 & w_b^3 & w_c^3 & w_d^3 \end{bmatrix} \begin{bmatrix} e_a \\ e_b \\ e_c \\ e_d \end{bmatrix} = \begin{bmatrix} S_0 \\ S_1 \\ S_2 \\ S_3 \end{bmatrix}.$$

Decomposing this into two equations:

$$\begin{bmatrix} w_a & w_b & w_c & w_d \\ w_a^2 & w_b^2 & w_c^2 & w_d^2 \\ w_a^3 & w_b^3 & w_c^3 & w_d^3 \end{bmatrix} \begin{bmatrix} e_a \\ e_b \\ e_c \\ e_d \end{bmatrix} = \begin{bmatrix} S_1 \\ S_2 \\ S_3 \end{bmatrix} \text{ and}$$

$$\begin{bmatrix} 1 & 1 & 1 & 1 \\ w_a & w_b & w_c & w_d \\ w_a^2 & w_b^2 & w_c^2 & w_d^2 \end{bmatrix} \begin{bmatrix} e_a \\ e_b \\ e_c \\ e_d \end{bmatrix} = \begin{bmatrix} S_0 \\ S_1 \\ S_2 \end{bmatrix}.$$

Suppose that in the search, location a with weight $w_a$ appears to be an error location. Multiplying the second equation above by $w_a$ and adding the first equation above, the effect of the error at a is eliminated:

$$\begin{bmatrix} w_b+w_a & w_c+w_a & w_d+w_a \\ w_b(w_b+w_a) & w_c(w_c+w_a) & w_d(w_d+w_a) \\ w_b^2(w_b+w_a) & w_c^2(w_c+w_a) & w_d^2(w_d+w_a) \end{bmatrix} \begin{bmatrix} e_b \\ e_c \\ e_d \end{bmatrix} = \begin{bmatrix} S_1+w_a S_0 \\ S_2+w_a S_1 \\ S_3+w_a S_2 \end{bmatrix} = \begin{bmatrix} T_0^{(a)} \\ T_1^{(a)} \\ T_2^{(a)} \end{bmatrix}.$$

Continuing in the search, location b with weight $w_b$ appears to be an error location. Decomposing this last equation into two, multiplying the second equation by $w_b$, and adding the first equation, the effect of the error at b is eliminated:

$$\begin{bmatrix} (w_c+w_b)(w_c+w_a) & (w_d+w_b)(w_d+w_a) \\ w_c(w_c+w_b)(w_c+w_a) & w_d(w_d+w_b)(w_d+w_a) \end{bmatrix} \begin{bmatrix} e_c \\ e_d \end{bmatrix} = \begin{bmatrix} U_0^{(a,b)} \\ U_1^{(a,b)} \end{bmatrix}$$

Continuing in the search, location c with weight Iv, appears to be an error location. Decomposing this last equation into two, multiplying the second equation by $w_c$, and adding the first equation, the effect of the error at c is eliminated:

$$(w_d+w_c)(w_d+w_b)(w_d+w_a)e_d = U_1^{(a,b)} + w_c U_0^{(a,b)} = V_0^{(a,b,c)}.$$

Continuing in the search, location d with weight $w_a$ is confirmed to be the last error location. The error value at location d is $$e_d = V_0^{(a,b,c)}/(w_d+w_c)(w_d+w_b)(w_d+w_a).$$

With the known location weights, the other error values can be determined similarly.

$$e_c = V_0^{(a,b,d)}/(w_c+w_d)(w_c+w_b)(w_c+w_a), \text{ where}$$

$$V_0^{(a,b,d)} = U_1^{(a,b)} + w_d U_0^{(a,b)}.$$

Similarly $$e_b = V_0^{(a,c,d)}/(w_b+w_d)(w_b+w_c)(w_b+w_a), \text{ where}$$

$$V_0^{(a,c,d)} = U_1^{(a,c)} + w_d U_0^{(a,c)} = T_2^{(a)} + w_c T_1^{(a)} + w_d(T_1^{(a)} + w_c T_0^{(a)}).$$

A similar equation is available for the last error value $$e_a = V_0^{(b,c,d)}/(w_a+w_d)(w_a+w_c)(w_a+w_b), \text{ where}$$

$$V_0^{(b,c,d)} = U_1^{(b,c)} + w_d U_0^{(b,c)} = T_2^{(b)} + w_c T_1^{(b)} + w_d(T_1^{(b)} + w_c T_0^{(b)}).$$

However, it may be easier to return to the original weighted sum equation to provide, e.g., $$e_a = S_0 + e_b + e_c + e_d.$$

Using this method, the determination of error values can generally be completed during the search or shortly thereafter, using weighted sums that are modified in a similar manner as those used in erasure processing.

The error evaluation method is similar for any number of errors. The operations to determine an error value incorporate products/division in the locator subfield, and storage/modification of weighted sums, which may be combined using a weight multiplier 200. Components for these relatively simple operations may be incorporated in a specialized weight modifier (not shown), ALU 315 or a modified ACSCU (not shown).

III. Encoder Post-Processor

The purpose of a systematic encoder is to process the data, $\{c_0, c_1, c_2, \ldots, c_{k-1}\}$ and append r symbols of redundancy $\{c_k, c_{k+1}, \ldots, c_{k+r-1}\}$ such that each weighted sum $$S_p = \sum_{j=0}^{n-1} w_j^{p-p_0} c_j = 0$$

for $0 \leq p < r$. When the redundant symbols to be determined by an encoder are always assigned to locations with the same weights, as in the preferred embodiments, the matrix equation governing the encoder has constant weights. The constant weights lead to constant encoder scalars, as defined below, and encoding is optimized by determining all encoder scalars used in advance.

A first step in the encoding method presented is to process each of the k data symbols to provide a plurality of preliminary weighted sums, $$U_p = \sum_{j=0}^{k-1} w_j^{p-p_0} c_j = 0$$

where $0 \leq p < r$. A second step uses the plurality of preliminary weighted sums to determine the r remaining symbols of the codeword. In order to have a plurality of weighted sums equal to zero, it follows that the encoder must satisfy an equation similar to that of the error evaluator. Preferably, the locator field is a subfield GF(L) of the symbol field GF(Q). Additional complexity savings are available if the location weights used in an encoder post-processor belong to a further subfield of the locator field.

For example, when (r=7) and ($p_0$=3), it may be preferable to use a locator field and a symbol field that may be constructed as extension fields of the smallest suitable field GF(8), i.e., extension fields with symbols having a multiple of three bits per symbol. The multiplication table for GF(8) is provided in octal for reference in Table 2 of the Appendix. When the preferred weighting is used, the redundancy locations have fixed weights {7, 6, 5, 4, 3, 2, 1}, and the encoder redundancy must satisfy an encoder weighting equation $$\begin{bmatrix} 5 & 4 & 3 & 2 & 7 & 6 & 1 \\ 6 & 5 & 4 & 3 & 2 & 7 & 1 \\ 4 & 3 & 2 & 7 & 6 & 5 & 1 \\ 1 & 1 & 1 & 1 & 1 & 1 & 1 \\ 7 & 6 & 5 & 4 & 3 & 2 & 1 \\ 3 & 2 & 7 & 6 & 5 & 4 & 1 \\ 2 & 7 & 6 & 5 & 4 & 3 & 1 \end{bmatrix} \begin{bmatrix} c_{n-7} \\ c_{n-6} \\ c_{n-5} \\ c_{n-4} \\ c_{n-3} \\ c_{n-2} \\ c_{n-1} \end{bmatrix} = \begin{bmatrix} U_0 \\ U_1 \\ U_2 \\ U_3 \\ U_4 \\ U_5 \\ U_6 \end{bmatrix}.$$

Inverting the left-side weighting matrix in GF(8), it follows that an encoder scaling equation is $$\begin{bmatrix} 2 & 3 & 7 & 1 & 4 & 6 & 5 \\ 7 & 2 & 6 & 1 & 3 & 5 & 4 \\ 6 & 7 & 5 & 1 & 2 & 4 & 3 \\ 5 & 6 & 4 & 1 & 7 & 3 & 2 \\ 4 & 5 & 3 & 1 & 6 & 2 & 7 \\ 3 & 4 & 2 & 1 & 5 & 7 & 6 \\ 1 & 1 & 1 & 1 & 1 & 1 & 0 \end{bmatrix} \begin{bmatrix} U_0 \\ U_1 \\ U_2 \\ U_3 \\ U_4 \\ U_5 \\ U_6 \end{bmatrix} = \begin{bmatrix} c_{n-7} \\ c_{n-6} \\ c_{n-5} \\ c_{n-4} \\ c_{n-3} \\ c_{n-2} \\ c_{n-1} \end{bmatrix}.$$

The redundant symbols are provided by various linear combinations of the preliminary weighted sums $\{U_i\}$ using the left-side "encoder scalar" matrix of the equation above. Note that each linear combination is provided by the summation of a plurality of simplified multiplications, each simplified multiplication used to multiply a preliminary weighted sum from GF(Q) by an element of a small encoder scalar field, e.g. GF(8), contained within GF(L).

A preferred embodiment uses GF(16) as the encoder scalar field. The field GF(16) supports up to 15 redundant symbols, and provides preferable symbol sizes which are multiples of four bits, as in the 8-bit locator field GF(L) and 32-bit symbol field GF(Q) of examples above. U.S. application Ser. No. 13/541,739, Construction Methods for Finite Fields with Split-Optimal Multipliers (2012) discloses a method of constructing the 8-bit locator field GF(256) as an extension field of GF(16) and the 32-bit symbol field GF(4,294,967,296) as an extension field of GF(256). Further, GF(16) can advantageously be represented as an extension field of GF(4).

If a number of redundant symbols to be provided is three, the weights for the redundancy locations are preferably members of the small subfield GF(4) as follows. When (r=3), ($p_0$=1), the locator field is constructed as an extension field of GF(4), and the preferred weights are used in redundancy locations with fixed weights (3, 2, 1). The encoder redundancy must satisfy the weighting equation $$\begin{bmatrix} 2 & 3 & 1 \\ 1 & 1 & 1 \\ 3 & 2 & 1 \end{bmatrix} \begin{bmatrix} c_{n-3} \\ c_{n-2} \\ c_{n-1} \end{bmatrix} = \begin{bmatrix} U_0 \\ U_1 \\ U_2 \end{bmatrix}.$$

Inverting the left-side weighting matrix, it follows that $$\begin{bmatrix} 3 & 1 & 2 \\ 2 & 1 & 3 \\ 1 & 1 & 1 \end{bmatrix} \begin{bmatrix} U_0 \\ U_1 \\ U_2 \end{bmatrix} = \begin{bmatrix} c_{n-3} \\ c_{n-2} \\ c_{n-1} \end{bmatrix}.$$

The multiplication table for GF(4) is provided for reference in Table 1 of the Appendix.

The multiplication table for GF(16), constructed as an extension field of GF(4), is provided in hexadecimal for reference in Table 3 of the Appendix. When (r=7) and ($p_0$=3), the encoder weighting equation is given in hexadecimal by $$\begin{bmatrix} 8 & 7 & B & 5 & 1 & 1 & 1 \\ B & F & 8 & E & 3 & 2 & 1 \\ 5 & C & 7 & D & 2 & 3 & 1 \\ 1 & 1 & 1 & 1 & 1 & 1 & 1 \\ 7 & 6 & 5 & 4 & 3 & 2 & 1 \\ 8 & 9 & B & A & 2 & 3 & 1 \\ B & 5 & 8 & 7 & 1 & 1 & 1 \end{bmatrix} \begin{bmatrix} c_{n-7} \\ c_{n-6} \\ c_{n-5} \\ c_{n-4} \\ c_{n-3} \\ c_{n-2} \\ c_{n-1} \end{bmatrix} = \begin{bmatrix} U_0 \\ U_1 \\ U_2 \\ U_3 \\ U_4 \\ U_5 \\ U_6 \end{bmatrix}.$$

The encoder scalar matrix in hexadecimal is the left-side matrix in $$\begin{bmatrix} B & E & 3 & 4 & E & 3 & F \\ 5 & 6 & 1 & 9 & 6 & 1 & C \\ 8 & F & 3 & 6 & F & 3 & E \\ 7 & 4 & 1 & A & 4 & 1 & D \\ 1 & 1 & 2 & 2 & 3 & 1 & 2 \\ 1 & 0 & 0 & 1 & 3 & 2 & 1 \\ 1 & 2 & 2 & 3 & 3 & 3 & 3 \end{bmatrix} \begin{bmatrix} U_0 \\ U_1 \\ U_2 \\ U_3 \\ U_4 \\ U_5 \\ U_6 \end{bmatrix} = \begin{bmatrix} c_{n-7} \\ c_{n-6} \\ c_{n-5} \\ c_{n-4} \\ c_{n-3} \\ c_{n-2} \\ c_{n-1} \end{bmatrix}.$$

In the Appendix, Tables 4-6 provide additional encoder weighting and scalar equations for r in the range from 4 to 6.

Alternatively, the redundant symbols in various encoded codewords may be assigned to locations with varying weights. In this case, the scalars must be determined as a function of the location weights, and can be determined in a manner similar to that of an error evaluation unit. When the encoder scalars are constant, an encoder post-processor simplifies significantly as shown in FIG. 6.

Figure 6:
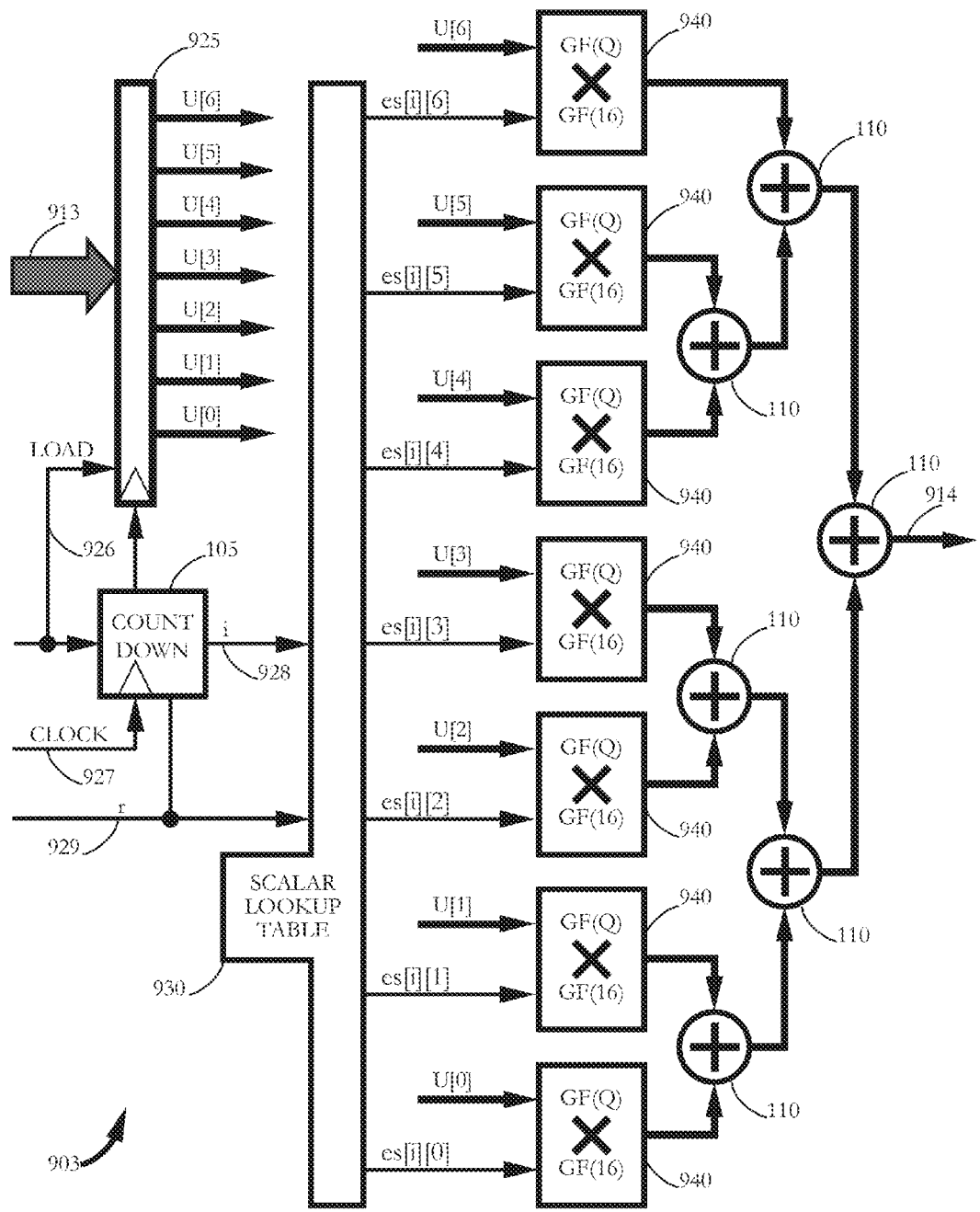
FIG. 6 is a schematic of an example encoder post-processor to provide redundant symbols as a function of preliminary weighted sums.

The example encoder post-processor 903 of FIG. 6 determines up to seven redundant symbols. The circuit has four inputs, interface 913 providing a plurality of preliminary weighted sums to staging register 925, a system CLOCK 927, LOAD signal 926, and a number of desired redundant symbols r 929. When the plurality of preliminary weighted sums are loaded into staging register 925, LOAD 926 is asserted so that the output, i 928, of counter COUNTDOWN 105 loads the value (r−1) on the next cycle of CLOCK 927. When LOAD 926 is deasserted, COUNTDOWN 105 decrements i 928 once per clock cycle and the values in staging register 925 remain unchanged until encoding is compete.

A memory containing SCALAR LOOKUP TABLE 930 is synthesized or loaded with the desired encoder scalars as a function of the desired number of redundant symbols r 929 and the output i 928 of COUNTDOWN 105. Preferably, the scalar field is GF(16), using an encoder scalar matrix for up to 15 redundant symbols as discussed above. The circuit shown is for up to seven redundant symbols, but extension to 15 is straight-forward. The selected r 929 and the output i 928 of COUNTDOWN 105 selects the $i^{th}$ row of the encoder scalar matrix for the desired number of redundant symbols r, denoted in this case as es[i][0]-es[i] [6]. If fewer than seven redundant symbols are desired, the high-order scalars are set equal to zero.

Seven weight multipliers 940 are used to provide the scalar weighting of the preliminary weighted sums. In this example, weight multipliers 940 are simplified multipliers similar to weight multiplier 200 of FIG. 2, but use weighting scalars from the smaller subfield GF(16). Instead of using four parallel 8-bit multipliers for 32-bit symbols as in 200, weight multiplier 940 uses eight parallel 4-bit multipliers for 32-bit symbols (not shown), a savings in area and power. Six GF(Q) adders 110 provide the sum of the seven weight multipliers 940 as an output symbol of the encoder, provided on output interface 914. In a total of r cycles of operation, the r redundant symbols are provided in the desired order.

Those of skill in the art will recognize that the encoding function, as well as various other functions in the improved forward error correction system, can be implemented through a variety of alternative means, without departing from the true scope and spirit of the invention, as limited only by the claims.

APPENDIX

Reference Tables for Small Fields and Encoders

TABLE 1

Product in GF(4)

|   | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 |

TABLE 2

Product in GF(8)

|   | 0 | 1 | 2 | 3 | 4 | 5 | 6 | 7 |
|---|---|---|---|---|---|---|---|---|
| 0 | 0 | 0 | 0 | 0 | 0 | 0 | 0 | 0 |
| 1 | 0 | 1 | 2 | 3 | 4 | 5 | 6 | 7 |
| 2 | 0 | 2 | 4 | 6 | 3 | 1 | 7 | 5 |
| 3 | 0 | 3 | 6 | 5 | 7 | 4 | 1 | 2 |
| 4 | 0 | 4 | 3 | 7 | 6 | 2 | 5 | 1 |
| 5 | 0 | 5 | 1 | 4 | 2 | 7 | 3 | 6 |
| 6 | 0 | 6 | 7 | 1 | 5 | 3 | 2 | 4 |
| 7 | 0 | 7 | 5 | 2 | 1 | 6 | 4 | 3 |

TABLE 3

Product in GF(16), represented as an extension of GF(4)

|   | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 1 | 0 | 1 | 2 | 3 | 4 | 5 | 6 | 7 | 8 | 9 | A | B | C | D | E | F |
| 2 | 0 | 2 | 3 | 1 | 8 | A | B | 9 | C | E | F | D | 4 | 6 | 7 | 5 |
| 3 | 0 | 3 | 1 | 2 | C | F | D | E | 4 | 7 | 5 | 6 | 8 | B | 9 | A |
| 4 | 0 | 4 | 8 | C | A | E | 2 | 6 | F | B | 7 | 3 | 5 | 1 | D | 9 |
| 5 | 0 | 5 | A | F | E | B | 4 | 1 | 7 | 2 | D | 8 | 9 | C | 3 | 6 |
| 6 | 0 | 6 | B | D | 2 | 4 | 9 | F | 3 | 5 | 8 | E | 1 | 7 | A | C |
| 7 | 0 | 7 | 9 | E | 6 | 1 | F | 8 | B | C | 2 | 5 | D | A | 4 | 3 |
| 8 | 0 | 8 | C | 4 | F | 7 | 3 | B | 5 | D | 9 | 1 | A | 2 | 6 | E |
| 9 | 0 | 9 | E | 7 | B | 2 | 5 | C | D | 4 | 3 | A | 6 | F | 8 | 1 |
| A | 0 | A | F | 5 | 7 | D | 8 | 2 | 9 | 3 | 6 | C | E | 4 | 1 | B |
| B | 0 | B | D | 6 | 3 | 8 | E | 5 | 1 | A | C | 7 | 2 | 9 | F | 4 |
| C | 0 | C | 4 | 8 | 5 | 9 | 1 | D | A | 6 | E | 2 | F | 3 | B | 7 |
| D | 0 | D | 6 | B | 1 | C | 7 | A | 2 | F | 4 | 9 | 3 | E | 5 | 8 |
| E | 0 | E | 7 | 9 | D | 3 | A | 4 | 6 | 8 | 1 | F | B | 5 | C | 2 |
| F | 0 | F | 5 | A | 9 | 6 | C | 3 | E | 1 | B | 4 | 7 | 8 | 2 | D |

TABLE 4

Encoder coefficients for r = 4 using GF(16) of Table 3.

$$\begin{bmatrix} E & 3 & 2 & 1 \\ D & 2 & 3 & 1 \\ 1 & 1 & 1 & 1 \\ 4 & 3 & 2 & 1 \end{bmatrix} \begin{bmatrix} c_{n-4} \\ c_{n-3} \\ c_{n-2} \\ c_{n-1} \end{bmatrix} = \begin{bmatrix} U_0 \\ U_1 \\ U_2 \\ U_3 \end{bmatrix}; \begin{bmatrix} E & 0 & 0 & E \\ 7 & 3 & 1 & 5 \\ F & 2 & 1 & C \\ 6 & 1 & 1 & 7 \end{bmatrix} \begin{bmatrix} U_0 \\ U_1 \\ U_2 \\ U_3 \end{bmatrix} = \begin{bmatrix} c_{n-4} \\ c_{n-3} \\ c_{n-2} \\ c_{n-1} \end{bmatrix}.$$

TABLE 5

Encoder coefficients for r = 5 using GF(16) of Table 3.

$$\begin{bmatrix} 8 & E & 3 & 2 & 1 \\ 7 & D & 2 & 3 & 1 \\ 1 & 1 & 1 & 1 & 1 \\ 5 & 4 & 3 & 2 & 1 \\ B & A & 2 & 3 & 1 \end{bmatrix} \begin{bmatrix} c_{n-5} \\ c_{n-4} \\ c_{n-3} \\ c_{n-2} \\ c_{n-1} \end{bmatrix} = \begin{bmatrix} U_0 \\ U_1 \\ U_2 \\ U_3 \\ U_4 \end{bmatrix}; \begin{bmatrix} A & 4 & 0 & A & 4 \\ 3 & E & 0 & 3 & E \\ C & A & 1 & E & 9 \\ 4 & B & 1 & 7 & 9 \\ 1 & B & 1 & 0 & A \end{bmatrix} \begin{bmatrix} U_0 \\ U_1 \\ U_2 \\ U_3 \\ U_4 \end{bmatrix} = \begin{bmatrix} c_{n-5} \\ c_{n-4} \\ c_{n-3} \\ c_{n-2} \\ c_{n-1} \end{bmatrix}.$$

TABLE 6

Encoder coefficients for r = 6 using GF(16) of Table 3.

$$\begin{bmatrix} 7 & B & 5 & 1 & 1 & 1 \\ F & 8 & E & 3 & 2 & 1 \\ C & 7 & D & 2 & 3 & 1 \\ 1 & 1 & 1 & 1 & 1 & 1 \\ 6 & 5 & 4 & 3 & 2 & 1 \\ 9 & B & A & 2 & 3 & 1 \end{bmatrix} \begin{bmatrix} c_{n-6} \\ c_{n-5} \\ c_{n-4} \\ c_{n-3} \\ c_{n-2} \\ c_{n-1} \end{bmatrix} = \begin{bmatrix} U_0 \\ U_1 \\ U_2 \\ U_3 \\ U_4 \\ U_5 \end{bmatrix};$$

$$\begin{bmatrix} B & C & C & B & C & C \\ 9 & 9 & 7 & 9 & 9 & 7 \\ 3 & 6 & B & 3 & 6 & B \\ E & D & B & F & F & 8 \\ B & 8 & 7 & A & B & 5 \\ 4 & 6 & C & 5 & 7 & D \end{bmatrix} \begin{bmatrix} U_0 \\ U_1 \\ U_2 \\ U_3 \\ U_4 \\ U_5 \end{bmatrix} = \begin{bmatrix} c_{n-6} \\ c_{n-5} \\ c_{n-4} \\ c_{n-3} \\ c_{n-2} \\ c_{n-1} \end{bmatrix}.$$

What is claimed is:

1. A forward error correction apparatus comprising decoder apparatus to correct a sequence of coded symbols with errors, the decoder operative to
generate a plurality of weighted sums from the estimated coded symbols using pre-selected location weights;
provide a plurality of evaluator coefficients using the generated weighted sums;
evaluate a plurality of determinants using the evaluator coefficients;
combine the determinants to produce a plurality of locator polynomial coefficients, each locator polynomial coefficient equal to a quotient of determinants and each of said locator polynomials including roots corresponding to prospective remaining error locations as a function of a hypothetical error location;
verify a plurality of locator polynomials by checking coefficient limits and consistency with other verified locator polynomials;
combine the verifications to determine if a valid and unambiguous decoding solution exists and, if so, to provide a plurality of the locations of erroneous symbols in the sequence of coded symbols;
evaluate the correct symbol values at the error locations; and
correct the coded sequence at the error locations in a valid and unambiguous decoding solution.

2. The forward error correction apparatus of claim 1, further comprising a systematic encoder apparatus to provide a subsequence of (2t–1) redundant symbols to correct up to t erroneous symbols in an error correction decoder.

3. The forward error correction apparatus of claim 1, wherein the weighted sum generator provides the finite field sum of a plurality of products, each of said products the finite field product of a symbol from a finite field GF(Q) and an integer power of a preselected location weight from a subfield GF(L) of the finite field GF(Q).

4. The forward error correction apparatus of claim 1, wherein each preselected location weight is a distinct and nonzero member of a subfield GF(L) of a symbol field GF(Q).

5. The forward error correction apparatus of claim 1, wherein a preselected location weight associated with a location index i in a sequence of n coded symbols equals (n–i), wherein the location i is an index in the range from 0 to (n–1).

6. The forward error correction apparatus of claim 1, wherein each of said determinants is associated with a numerator polynomial or a denominator polynomial in a variable representing the location weight associated with a hypothetical error location.

7. The forward error correction apparatus of claim 1, wherein the combiner to provide a plurality of erroneous symbol locations counts and stores those hypothetical locations with a determinant equal to zero.

8. The forward error correction apparatus of claim 1, wherein the combiner to provide a plurality of erroneous symbol locations counts and stores those hypothetical locations with an associated locator polynomial such that all determined locator coefficients are in a subfield GF(L) of a finite field GF(Q).

9. The forward error correction apparatus of claim 1, wherein an error location associated with a verified locator polynomial is used to generate a set of modified weighted sums, the modified weighted sums used in determining a correct symbol in an erroneous symbol location.

10. The forward error correction apparatus of claim 1, wherein the quotient of determinants is provided using a subfield pseudo-divider to determine the quotient assuming a valid quotient is a member of a subfield GF(L) of the finite field GF(Q).

11. The forward error correction apparatus of claim 1, wherein a verified locator polynomial has roots at location weights associated with the locations where other verified locator polynomials are found.

12. A forward error correction apparatus comprising decoder apparatus to correct a sequence of coded symbols with errors, the decoder comprising a weighted sum generator, a coefficient provider, determinant evaluators, dividers, a verifier, a solution combiner, and an error evaluator, the decoder operative to
generate a plurality of weighted sums from the estimated coded symbols using pre-selected location weights;
provide a plurality of evaluator coefficients using the generated weighted sums;
evaluate a plurality of determinants using the evaluator coefficients;
divide to produce a plurality of locator polynomial coefficients, each locator polynomial coefficient a quotient of determinants;
verify a plurality of locator polynomials by checking coefficient limits with other verified locator polynomials;
combine the verifications to provide a plurality of the locations of erroneous symbols in the sequence of coded symbols; and
determine the correct symbol values at the error locations;
wherein the decoder determines the location of up to t erroneous symbols in a sequence of coded symbols including only (2t−1) redundant symbols; and
wherein one or more coded symbol locations is flagged as an erasure location, and the pre-selected weight associated with the erasure location is used to generate a set of modified weighted sums, the modified weighted sums used for determination of unknown error locations.

13. A forward error correction method to correct a sequence of coded symbols with errors, the method comprising steps to
generate a plurality of weighted sums from the estimated coded symbols using pre-selected location weights;
provide a plurality of evaluator coefficients using the generated weighted sums;
evaluate a plurality of determinants using the evaluator coefficients;
combine the determinants to produce a plurality of locator polynomial coefficients, each locator polynomial coefficient equal to a quotient of determinants and each of said locator polynomials including roots corresponding to prospective remaining error locations as a function of a hypothetical error location;
verify a plurality of locator polynomials by checking coefficient limits and consistency with other verified locator polynomials;
combine the verifications to determine if a valid and unambiguous decoding solution exists and, if so, to provide a plurality of the locations of erroneous symbols in the sequence of coded symbols;
evaluate the correct symbol values at the error locations; and
correct the coded sequence at the error locations in a valid and unambiguous decoding solution.

14. The forward error correction method of claim 13, further comprising an encoding method to provide a subsequence of (2t −1) symbols of redundancy to correct up to t erroneous symbols in an error correction decoder.

15. The forward error correction method of claim 13, wherein weighted sum generation provides the finite field sum of a plurality of products, each of said products the finite field product of a symbol from a finite field GF(Q) and an integer power of a preselected location weight from a subfield GF(L) of the finite field GF(Q).

16. The forward error correction method of claim 13, wherein each preselected location weight is a distinct and nonzero member of a subfield GF(L) of field GF(Q).

17. The forward error correction method of claim 13, wherein a preselected location weight associated with a location index i in a sequence of n coded symbols equals (n−i), wherein the location i is an index in the range from 0 to (n−1).

18. The forward error correction method of claim 13, wherein each of said determinants is associated with a numerator polynomial or a denominator polynomial in a variable representing the location weight associated with a hypothetical error location.

19. The forward error correction method of claim 13, further including counting and storing hypothetical locations with a determinant equal to zero.

20. The forward error correction method of claim 13, further including counting and storing hypothetical locations and associated locator coefficients when all determined locator coefficients are in a subfield GF(L) of a finite field GF(Q).

21. The forward error correction method of claim 13, wherein a location associated with a verified locator polynomial is used to generate a set of modified weighted sums, the modified weighted sums used in determining a correct symbol in an erroneous symbol location.

22. The forward error correction method of claim 13, wherein a verified locator polynomial has roots at location weights associated with the locations where other verified locator polynomials are found.

23. A forward error correction method to correct a sequence of coded symbols with errors, the method comprising steps to
generate a plurality of weighted sums from the estimated coded symbols using pre-selected location weights;
provide a plurality of evaluator coefficients using the generated weighted sums; evaluate a plurality of determinants using the evaluator coefficients;
divide to produce a plurality of locator polynomial coefficients, each locator polynomial coefficient a quotient of determinants;
verify a plurality of locator polynomials by checking coefficient limits and consistency with other verified locator polynomials;

combine the verifications to provide a plurality of the locations of erroneous symbols in the sequence of coded symbols; and determine the correct symbol values at the error locations;

wherein the method determines the location of up to t erroneous symbols in a coded sequence including only (2t−1) redundant symbols; and wherein one or more coded symbol locations is flagged as an erasure location, and the weight associated with the erasure location is used to generate a set of modified weighted sums, the modified weighted sums used for determination of unknown error locations.

* * * * *